United States Patent [19]

Yamada

[11] Patent Number: 4,931,850
[45] Date of Patent: Jun. 5, 1990

[54] SEMICONDUCTOR DEVICE INCLUDING A CHANNEL STOP REGION

[75] Inventor: Takahiro Yamada, Hirakata, Japan

[73] Assignee: Matsushita Electric Industrial Co., Ltd., Osaka, Japan

[21] Appl. No.: 370,082

[22] Filed: Jun. 21, 1989

Related U.S. Application Data

[63] Continuation of Ser. No. 251,005, Sep. 27, 1988, abandoned, which is a continuation of Ser. No. 881,101, Jul. 2, 1986, abandoned.

[30] Foreign Application Priority Data

Jul. 5, 1985 [JP] Japan .................................. 60-148710
Jul. 8, 1985 [JP] Japan .................................. 60-149530
Sep. 19, 1985 [JP] Japan .................................. 60-206812

[51] Int. Cl.$^5$ ...................... H01L 29/78; H01L 29/06; H01L 27/02
[52] U.S. Cl. ............................... 357/23.11; 357/23.14; 357/41; 357/42; 357/53; 357/55
[58] Field of Search ............. 357/23.11, 41, 42, 23.14, 357/23.1, 53, 55

[56] References Cited

U.S. PATENT DOCUMENTS

| | | | |
|---|---|---|---|
| 3,855,610 | 12/1974 | Masuda et al. | 357/41 |
| 3,983,620 | 10/1976 | Spadea | 357/42 |
| 4,321,616 | 3/1982 | Bise | 357/23.11 |
| 4,499,482 | 2/1985 | Levine | 357/23.14 |

FOREIGN PATENT DOCUMENTS

| | | | |
|---|---|---|---|
| 17720 | 5/1977 | Japan . | |
| 146577 | 12/1978 | Japan . | |
| 54-104782 | 8/1979 | Japan | 357/23.11 |
| 19749 | 5/1981 | Japan . | |
| 56-91461 | 7/1981 | Japan | 357/23.11 |

OTHER PUBLICATIONS

H. Tango et al., "Potential Field and Carrier Distribution in the Channel of Junction Field–Effect Transistors," *Solid State Electronics*, vol. 13, pp. 139–152, Oct. 1970.
Kyomasu et al., "Analysis of Latch–Up in CMOS IC," Papers of Electronics and Electrical Communication Association of Japan, vol. J61–C, No. 2, pp. 106–113, 1978.
E. Sun et al., "Breakdown Mechanism in Short–Channel MOS Transistors," *IEDM Technical Digest*, pp. 478–482, 1978.
H. C. Poon et al., "DC Model for Short–Channel IGFET's," *IEDM Technical Digest*, pp. 156–159, 1973.

Primary Examiner—Andrew J. James
Assistant Examiner—Ngan Van Ngo
Attorney, Agent, or Firm—Spencer & Frank

[57] ABSTRACT

An insulated gate SIT (IBCM-SIT) which is substantially free from punch-through and hot carriers and exhibits a triode characterisic. Also, an insulated gate SIT (ISIS-SIT) which exhibit a tetrode or pentode characteristic, not by an $r_s$ feedback effect, but by the addition of a static shield region. When those devices are used to construct a complementary circuit, no significant latch-up occurs.

6 Claims, 26 Drawing Sheets

FIG. 9(j)
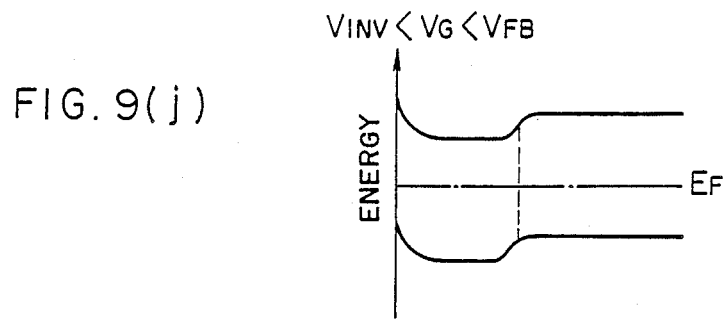
FIG. 9(k)
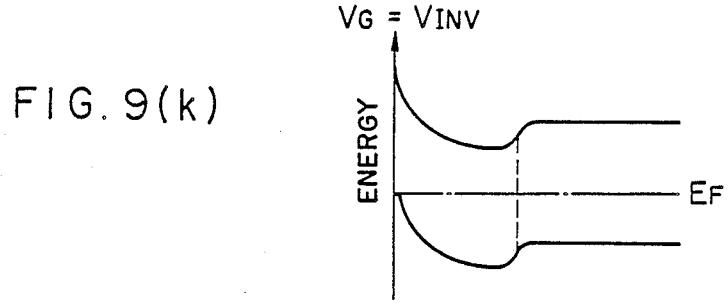
FIG. 9(ℓ)
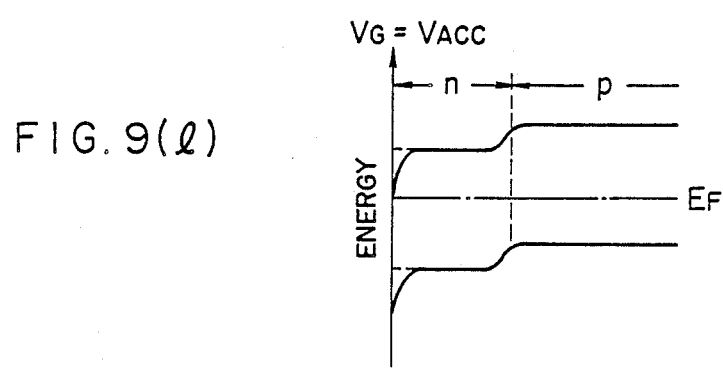
FIG. 9(m)
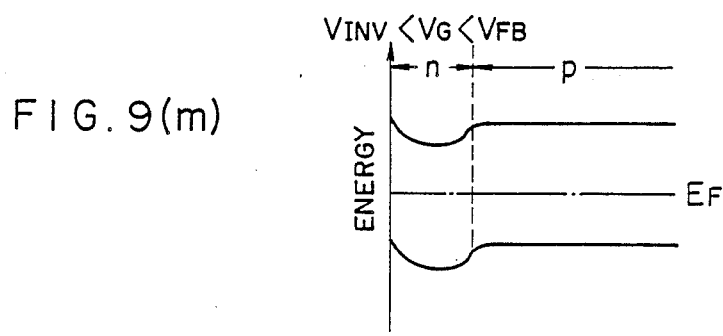

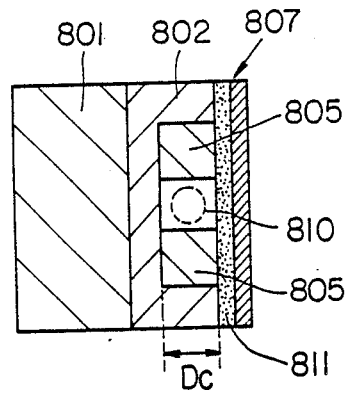
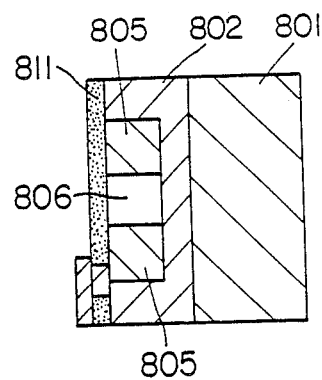
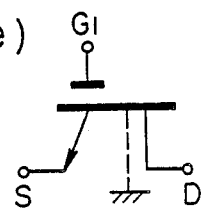
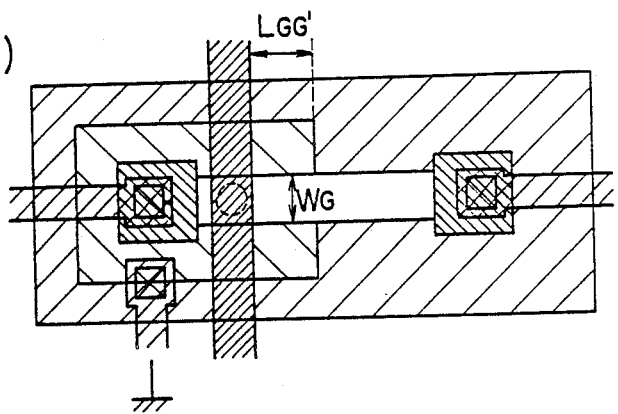
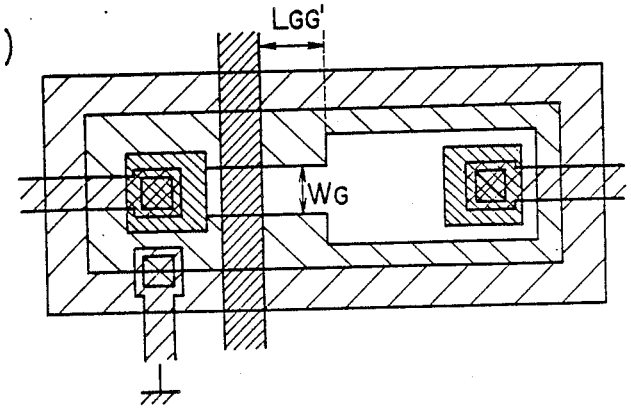

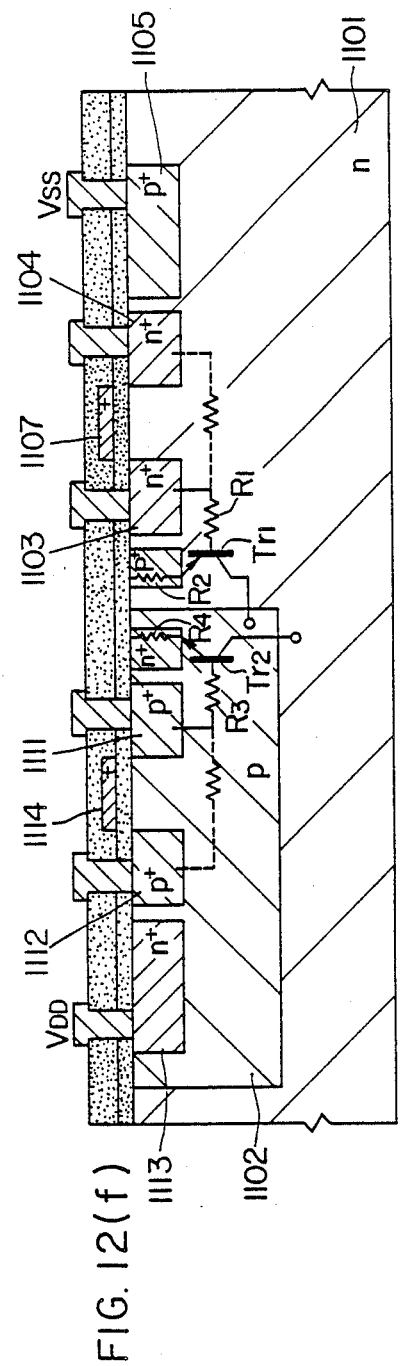
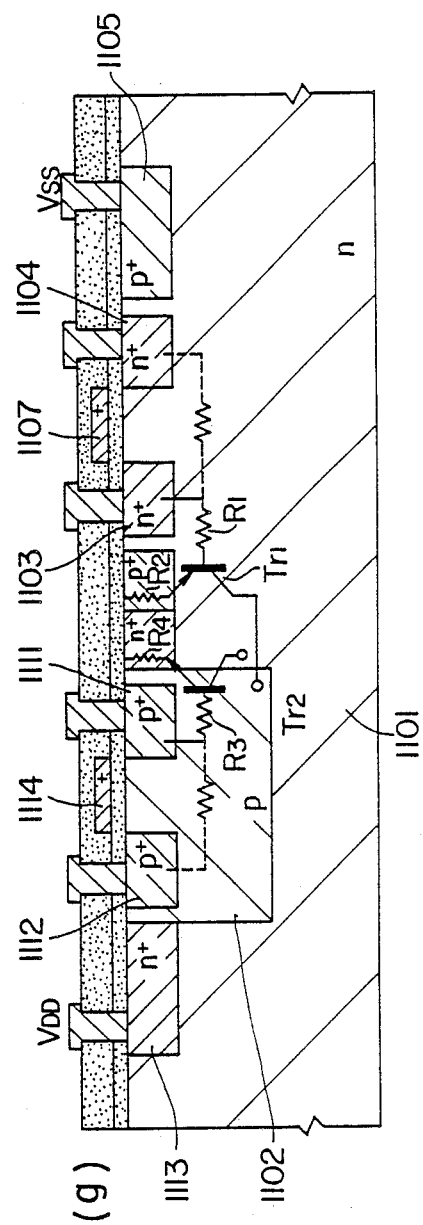
FIG. 12(f)
FIG. 12(g)

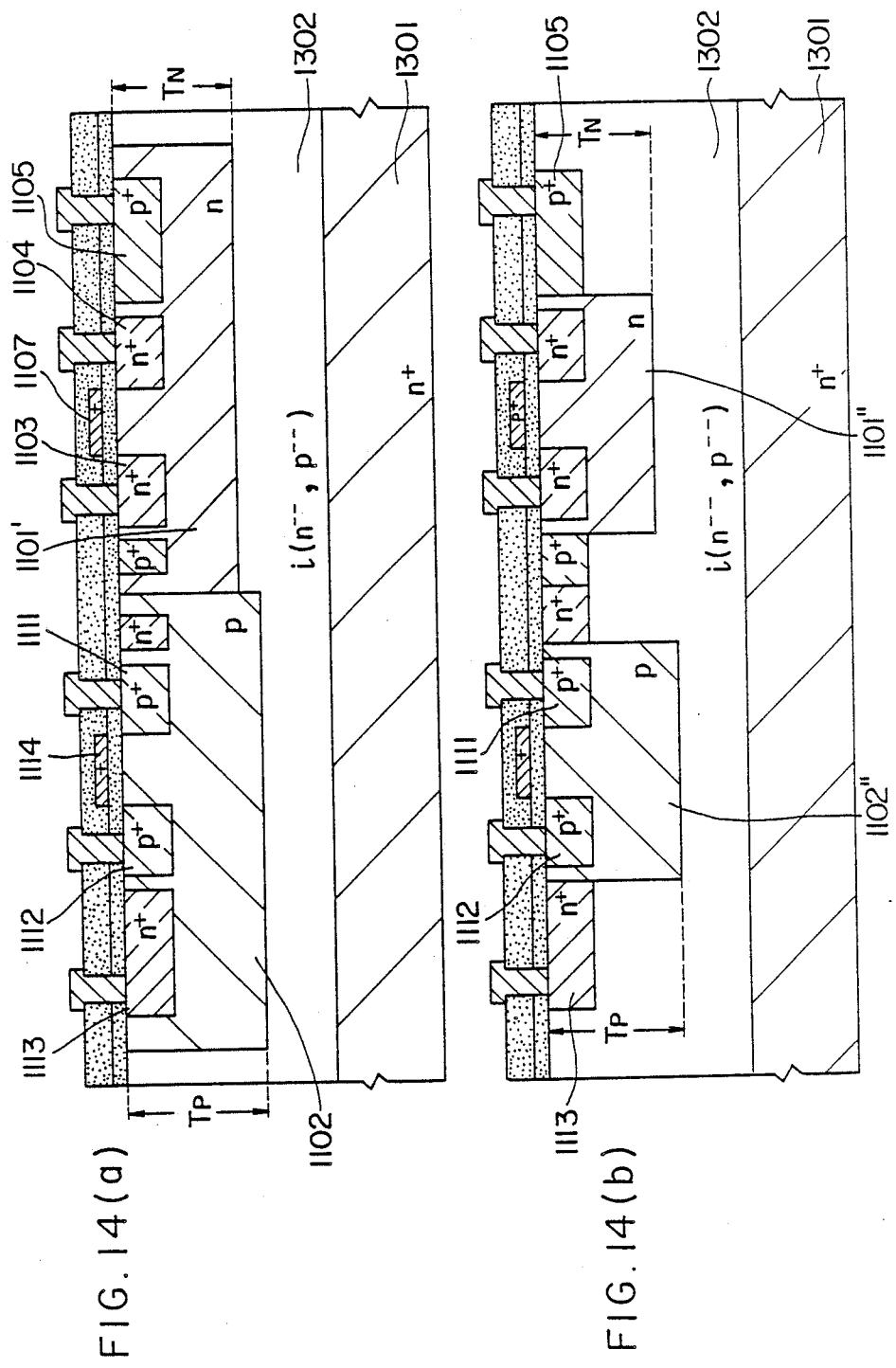

SEMICONDUCTOR DEVICE INCLUDING A CHANNEL STOP REGION

This application is a continuation of application Ser. No. 07/251,005, filed Sept. 27, 1988 which was a continuation of Ser. No. 06/881,101 filed Jul. 2nd, 1986 both now abandoned.

BACKGROUND OF THE INVENTION

Description of the Prior Art

The basic structure and operational characteristic of a static induction transistor (SIT) are first explained. FIG. 1 (a) shows a sectional view of a vertical (thicknesswise of a substrate) junction gate type SIT and the potential distribution therein.

The SIT comprises a source n+ region 101 (impurity concentration $N = 10^{17} - 10^{20}$ cm$^{-3}$), a drain n+ region 102 ($N = 10^{17} - 10^{20}$ cm$^{-3}$), a gate n+ region 103 ($N = 10^{17} - 10^{20}$ cm$^{-3}$) and an epitaxially grown channel n region 104 ($N = 10^{12} - 10^{17}$ cm$^{-3}$). It has a smaller channel dimension and a lower impurity concentration in the channel area than an FET. Thus, under a zero gate bias condition or when a slight backward voltage is applied to the gate, a depletion layer 110 spreads as shown in FIG. 1 (d) and the device is pinched off.

At this time, a saddle-shaped potential barrier 105 as shown in FIG. 1 (b) appears in front of the source n+ region 101. The height of the potential barrier 105 controls the flow rate of carriers which mainly flow from the source to the drain over the potential barrier. Since the potential barrier 105 functions essentially as a gate, it is also called an "intrinsic gate" and the region in which the potential barrier 105 exists is called an "intrinsic gate region" 107.

Since the channel impurity concentration is low, the depletion layer 110 spreads with a small voltage applied across the gate and the drain as shown in FIG. 1 (e) so that the entire channel can be readily occupied by the depletion layer.

If the drain voltage is further increased, the height of the potential barrier (which is also a pinch-off potential) which controls the flow rate of the carriers is reduced and the barrier position (pinch-off point) moves toward the source. As a result, the quantity of carriers which are moved over the barrier increases and the drain voltage rises and the drain current increases to exhibit a current nonsaturation characteristic (Japanese Examined Patent Publication Nos. 52-77720 and 56-19749).

The above phenomenon which is inherent to the SIT, that is, (1) the channel pinch-off occurs without regard to the drain region and (2) the entire channel region is covered by the depletion layer, and is defined as reachthrough. (This indicates that the depletion area spreads over the entire region and finally reaches the drain.) A characteristic of the reach-through is that the gate directly controls the saddle-shaped potential barrier and the drain controls the potential barrier through a coupling capacitance.

The carriers which flow from the source to the drain over the saddle-shaped potential barrier are concentrated into a center 106 of the channel.

FIG. 1 (c) shows the potential distribution of the SIT. (Potential distributions as viewed along broken lines A and B of FIG. 1 (a) correspond to A' and B' in FIG. 1 (c).) The coordinate at the center of the source is represented by (0, 0) and the Y-axis is defined from the source to the drain. The gate exists at $Y = Y_G$ along the X-axis, and a gate voltage is applied at $X = \pm X_G$. The drain exists at $Y = Y_D$ and the source exists at $Y = 0$. The depletion layer extends from $Y_G$ to $Y_s$ toward the source and to $Y_d$ toward the drain.

Since the junction gate type SIT is normally on, it is disadvantageous in an integrated circuit. Thus, the channel is normally pinched off only by a diffusion potential in the gate P+ region 103, and a forward voltage is applied to the gate to cancel the diffusion potential to supply a current into the channel so that a normally-off operation is attained. However, in such forward operation, holes are injected below the gate P+ region 103 and a storage effect takes place. As a result, high speed operation is restricted.

In order to maintain the basic characteristic of the SIT and eliminate the minority carrier (hole) storage effect, an SIT having an insulated gate has been proposed (Japanese Unexamined Patent Publication No. 53-146577).

FIG. 2 (a) shows a sectional view of a lateral (along the substrate surface) insulate gate SIT. The SIT comprises a P substrate 201 ($N = 10^{12} - 10^{17}$ cm$^{-3}$), a source n+ region 202 ($N = 10^{17} - 10^{20}$ cm$^{-3}$) formed thereon, a drain n+ region 203 ($N = 10^{17} - 10^{20}$ cm$^{-3}$) and a gate electrode 204 formed on an insulation layer 205. The gate electrode 204 does not reach the top of the source n+ region 202 as opposed to a conventional MOS FET, so that the surface potential in the vicinity of the source n+ region 202 is set lower than those in other regions and it functions as a barrier to the electrons which flow through the inversion layer from the source to the drain. It is the height of the barrier that controls the quantity of electrons to be injected into the drain inversion layer 210 from the source.

If the distance $L_{SG}$ between the source and the gate of the insulated gate type SIT is short, a current nonsaturation characteristic will readily appear, but since the current flows through a surface channel of the inversion layer 210, the influence of the interface is large and it is not an ideal one from the standpoints of speed and noise characteristics. When the drain voltage increases, the punch-through by the depletion layer occurs as shown in FIG. 2 (b) and a punch-through current flows as shown by the arrow 62 and control by the saddle-shaped potential barrier is lost. The punch-through is defined as the spread of the depletion layer 211 of the drain region due to the drain region potential such that it contacts to the depletion layer of the source region in a wide area and the saddle-shaped potential barrier is no longer dominant.

A first problem to be resolved in the prior art insulated gate type SIT is the elimination of the punchthrough.

The nonsaturation characteristic of the drain current versus drain voltage which is also a characteristic of the prior art SIT is due to the fact that the height of the saddle-shaped potential barrier of the intrinsic gate region depends on both the gate voltage and the drain voltage, but it has a disadvantage in that a voltage gain is hard to attain. The gain $A_V$ per stage of an amplifier is given by $$A_v = g_m R_L \times \frac{1}{1 + \frac{R_L}{r_D}} \quad (1)$$

where $g_m = (\leftarrow I_D/\leftarrow V_G)$: mutal conductance
$r_D = 1/(\leftarrow I_D/\leftarrow V_D)$: drain internal resistance
$R_L$: load resistance
$I_D$: drain current
$V_G$: gate voltage
$V_D$: drain voltage The larger the $r_D$, that is, the higher the degree of the saturation characteristic, the higher is the voltage gain.

However, when the saturation characteristic is realized by a negative feedback effect due to the source internal resistance $r_s$ (see H. Tango et al: Solid State Electronics, Vol. 13 p. 139, Oct. 1970) as is done in a conventional FET, an apparent mutual conductance gm' is observed (In the past, it has been misunderstood as a mutual conductance of the FET.)

$$g_m' = \frac{g_m}{1 + r_s g_m} \quad (2)$$

If $r_s$ is large, the saturation characteristic is attained but the gm' is apparently smaller than the gm which is attained by the intrinsic gate.

So far, a principle to realize the saturation characteristic while maintaining the high gm and the high speed attained in the nonsaturation type insulated gate SIT and without increasing $r_s$ (that is, without depending on the feedback effect), has not been proposed.

If the saddle-shaped potential barrier of the SIT can be controlled only by the gate electrode, design of a multi-stage amplifier circuit will be facilitated.

Accordingly, a second problem to be resolved in the prior art insulated gate type SIT is realization of the intrinsic saturation characteristic in the insulated gate type SIT.

When an integrated circuit is to be constructed by using the insulated gate type SIT, a complementary circuit which is advantageous in density, microminiaturization, ease of design and power consumption will be a main component. However, when the microminiaturization is carried out with the complementary MOS-FET (C-MOS), there are several problems, and when the complementary structure is used in the insulated gate type SIT, those problems must be resolved.

A typical C-MOS inverter is shown in FIG. 3 (a). A p well region 302 is formed on an n substrate 301, and a source P+ region 303, a drain P+ region 304 and an insulated gated electrode 305 on the n substrate 301 form a PMOS (p-channel MOSFET), and a source n+ region 306, a drain n+ region 307 and an insulated gate electrode 308 on the p well region 302 form an nMOS (n-channel MOSFET). The gate electrodes 305 and 308 are interconnected to provide an input terminal, and the drain p+ region 304 and the drain n+ region 307 are interconnected to provide an output terminal. The source p+ region 303 is adjacent to a channel stopper n+ region 309 which also sets the potential of the p substrate 301, and a voltage $V_{DD}$ is applied to the source p+ region 303. The source n+ region 306 is adjacent to a channel stopper p+ region 310 which also sets the potential of the p well 302. A voltage $V_{SS}$ is applied to the source n+ region 306 ($V_{DD} > V_{SS}$).

In order to achieve the high density and the microminiaturization of such CMOS-FET, it is necessary to overcome the following three problems.

First Problem

Latch-Up (Cause: Parasitic Thyristor)

The structure of the prior art MOS-FET essentially forms a parasitic thyristor. As shown in FIG. 3 (a), lateral pnp transistors Tr$_1$ and Tr$_3$ have the source p+ region 303 and the drain p+ region 304 of the PMOS, respectively, as emitters, the n substrate 301 as bases and the p well region 302 as collectors. Vertical npn transistors Tr$_2$ and Tr$_4$ have the source n+ region 306 and the drain n+ region 307 of the n MOS, respectively, as emitters, the p well region 302 as bases and the n substrate 301 as collectors.

Resistors for applying biases to the bases of those transistors are designated by R$_1$ and R$_3$. As shown in FIG. 3 (a), they are resistors between the n+ region 309 and the n substrate 301, and between the p+ region 310 and the p well region 302, respectively, and they are distributed constant resistors formed in the vicinities of the diffusion layers. In the CMOS-FET (CMOS), the resistances R$_1$ and R$_3$ are usually very low because the n+ region 309 and the p+ region 310 which act as the $V_{DD}$ electrode and the $V_{SS}$ electrode, respectively, are formed adjacently to the source p+ region 303 of the PMOS and the source n+ region 306 of the n MOS.

On the other hand, while emitter resistances R$_2$ and R$_4$ of the transistors Tr$_1$ and Tr$_2$ have been neglected in the past, they cannot be neglected when the turn on phenomenon of the parasitic thyristor is considered. (See Kyomasu et al: "CMOS IC latch-up" Papers of Electronics and Electrical Communication Association of Japan, Vol. J61-C, No. 2, pages 106–113, 1978.)

FIG. 3 (b) shows a conventional equivalent circuit of a parasitic thyristor, and FIG. 3 (c) shows a more precise equivalent circuit. Before the turn-on condition of the CMOS parasitic thyristor is explained with reference to FIG. 3 (c), the manner of turn-on is explained with reference to FIGS. 3 (d) and 3 (e).

In FIG. 3 (d), when $V_N > V_{DD}$ is applied to the output terminal as a noise voltage, the base-emitter of the transistor Tr$_3$ connected to the output terminal is forwardly biased and Tr$_3$ is turned on. As a result, a noise current flows into $V_{SS}$ through a base resistance R$_3$ of Tr$_2$ as shown by an arrow A. As a result, Tr$_2$ is turned on and a current flows from $V_{DD}$ through a base resistance R$_1$ of Tr$_1$ as shown by an arrow B and Tr$_1$ is turned on. The base of Tr$_2$ is again biased by a collector current (arrow C) of Tr$_1$. As a result, a positive feedback is applied to a closed loop of the transistors Tr$_1$ and Tr$_2$ and a constant current flows between the power supply terminals $V_{DD}$ and $V_{SS}$ even after the noise voltage has been terminated. This is called latch-up.

In FIG. 3 (e), when $V_N' < V_{SS}$ is applied to the output terminal as a noise voltage, the base-emitter of Tr$_4$ is forwardly biased and Tr$_4$ is turned on. As a result, a noise current flows from $V_{DD}$ to the output terminal through the base resistance R$_1$ as shown by an arrow D. As a result, Tr$_1$ is turned on and a current flows from $V_{DD}$ through a base resistance R$_2$ of Tr$_2$ as shown by an arrow C so that Tr$_2$ is turned on. The base of Tr$_1$ is again biased by the collector current (arrow B) of Tr$_2$ and the latch-up occurs.

In the equivalent circuit of FIG. 3 (d), when $V_N'$ is applied. Tr$_4$ is turned on, and if $V_N$ is applied in FIG. 3 (e), Tr$_3$ is turned on. Which one will be more likely to occur depends on the magnitudes of R$_1$ and R$_3$.

Referring to FIG. 3 (c), the turn-on condition is determined. The forward bias of the transistors $Tr_1$ and $Tr_2$ is $V_F$, the current amplification factor is $\alpha$, the collector saturation current is $I_C$, the base current is $I_B$, the thyristor gate trigger current is $I_g$ and the anode current is $I_A$. Then, $$I_A = \frac{A}{B} \quad (3)$$

where
$A=[\{(I_{C1}+I_{C2})R_1+V_F\}\{(1-\alpha_2)R_3+R_4\}+(R_3I_g-V_F)\alpha_2R_1+(I_{c1}+I_{c2})R_3\alpha_1R_1]$
$B=[\{(R_1+R_2)(R_3+R_4)-\alpha_1R_1(R_3+R_4)-\alpha_2R_3(R_1+R_2)\}]$ Accordingly, the turn-on condition (B=0) is given by $$\frac{\alpha_1 R_1}{R_1 + R_2} + \frac{\alpha_2 R_3}{R_3 + R_4} = 1 \quad (4)$$

In the conventional equivalent circuit shown in FIG. 3 (b), $R_1$ and $R_3$ are infinite and $R_2$ and $R_4$ are zero. Thus, the formula (4) is represented as $$\alpha_1 + \alpha_2 = 1 \quad (5)$$

(The formula (5) is derived when one of the conditions $R_1, R_3 \to \infty$ and $R_2, R_4 \to 0$ is met.)

By using $\beta(=\alpha/(1-\alpha))$ of $Tr_1$ and $Tr_2$, the formula (5) may be represented as $$\beta_1 \times \beta_2 = 1 \quad (6)$$

From the formula (6), it is necessary that $\beta$ of $Tr_1$ and $Tr_2$ is as small as possible to prevent the turn-on of the parasitic thyristor.

Typical methods for preventing the CMOS latch-up are shown in Table 1. When microminiaturization is a goal, it is impossible to perfectly prevent latch-up except for the case A. From formula (4), latch-up does not occur if $$R_2 >> R_1, R_2 >> R_4 \quad (7)$$

is met even if the formulas (5) and (6) are met, but the operation range of the CMOS is narrowed due to the voltage drops across $R_2$ and $R_4$ and the performance is lowered. FIG. 4 shows CMOS sections corresponding to cases A–E of Table 1.

TABLE 1

| | Methods for preventing CMOS latch-up | | |
|---|---|---|---|
| Case | Principle | Advantage | Disadvantage |
| A | MOS Tr's are insulation-isolated to prevent formation of a parasitic thyristor | Ideal method to prevent latch-up | Manufacturing process is complex. |
| B | Electrical paths between pnp Tr's and npn Tr's in the parasitic thyristor are cut off. | Conventional manufacturing process can be used. | Chip area increases. |
| C | An effective base length of a vertical npn Tr is increased to reduce $h_{FE}$ | Chip area does not increase. | Manufacturing process is complex. |
| D | An effective base length of a lateral pnp Tr is increased to reduce $h_{FE}$. | Conventional manufacturing process can be used. | Chip area increases. |
| E | A holding current of a parasitic thyristor is increased to prevent the latch-up. | Conventional manufacturing process can be used and chip area does not change. | Voltage drop across an output transistor is produced. |

No proposal to prevent latch-up with the existing technique has been made so far.

Second Problem

Hot Carrier Effect [Cause: High Electric Field]

The high density or microminiaturization of the MOSFET is usually implemented by a proportional reduction rule (which is also called a scaling rule). However, the power supply voltage frequently cannot be proportionally reduced because of a requirement of matching the power supply voltage to a TTL level and a requirement of a high operating voltage in a high performance circuit.

In a microminiaturized MOSFET in which the power supply voltage is not reduced, the electric field in the element rises due to the reduction of gate length, gate oxidation film thickness and source/drain junction depth and the increase of impurity concentration in the channel.

Because of such a high electric field, the electrons flowing through the channel are hot and collision ionization takes place in the vicinity of the drain 503 as shown in FIG. 5 (a) so that a number of electron-hole pairs are generated. A portion of the generated carriers is directed to the interface of the oxidation film 504 and injected therein and a portion is captured or generates an interface level. Of the injected electrons, those having large energies pass through the gate oxidation film and reach the gate electrode 505 produce a gate current.

On the other hand, those of the generated holes which flow into the substrate 501 produce a substrate current $I_{sub}$. The substrate current $I_{sub}$ raises the substrate voltage in the vicinity of the source n+ region 502. When the source-substrate voltage reaches approximately 0.6 V, the source-substrate junction is forwardly biased and the electrons are injected from the source n+ region 502 into the p substrate 501. As a result, the source n+ region 502, p substrate 501 and drain n+ region 503 function as an npn bipolar transistor as shown in FIG. 5 (b), and the drain-source breakdown voltage $BV_{Ds}$ which is smaller than the drain breakdown voltage $BV_{Dsub}$ becomes dominant. Namely, $$BV_{DS} \simeq BV_{Dsub} \times \frac{1}{2^{\frac{1}{n}}} \cdot \left(\frac{L}{L_D}\right)^{\frac{2}{n}} \quad (8)$$

$(4 \leq n \leq 6)$ where

L: channel length
$L_D$: diffusion length
From the formula (8), it is seen that $BV_{DS}$ decreases as L decreases. [Se E. Sun et al: 1978 IEDM Technical Digest, p. 478]

In order to prevent the generation of hot carriers due to the high electric field in the pn junction, a high breakdown structure (low doped drain -LDD) has been proposed but it is not necessarily effective and a radical measure to prevent the generation of the high electric field has not been proposed.

Third Problem

Short Channel Effect [Cause: Punch-Through]

In the short channel MOSFET, it is known that the threshold voltage falls when the channel length is approximately equal to the sum of the depletion layer width of the source 602 and the drain diffusions. A sectional view of the n-channel MOSFET under such a condition is shown in FIG. 6 (a).

Charges in the depletion layer induced by the voltage of the gate 605 is approximated to be within a trapezoidal area having sides l and $l_1$ and a height h. The quantity of charges (per unit area) is approximated by $$\rho depl = qhN_A(l+l_1)/2l \quad (9)$$

This is the charge of the depletion layer to be induced by the gate at the threshold. In the short channel FET, $l_1$ is much shorter than l and $l_1$ is almost zero. As a result, the punch-through takes place. The punch-through current flows in deep path spaced from the surface. The width r of the depletion layer of the drain 603 is given by $$r = (2\epsilon V_{DB}/qN_A)^{\frac{1}{2}} \quad (10)$$

where
$\epsilon$: dielectric constant $V_{DB} = V_D - V_B + V_{bi}$
$N_A$: acceptor concentration of p substrate
q: quantity of charge per unit area
$V_{bi}$: built-in potential of drain junction
$V_B$: substrate bias If l is long, $\rho depl$ in the formula (9) approaches a constant $\rho_L = qhN_A/2$. The threshold is represented as follows by using $P_L$ and a capacitance Co of the oxidation layer.

$$V_T = -\frac{2\phi_b kT}{q} + V_{FB} - \frac{1}{C_o} \cdot \left(\frac{\rho depl}{\rho_L}\right)$$

$$\left[2\epsilon N_A q \left(V_C - V_B \frac{2\phi_b kT}{q}\right)\right]^{\frac{1}{2}} \quad (11)$$

where
$\phi_b = (E_F - E_{Fi})/kT$: bulk potential
$V_{FB}$: flat band voltage
$V_C$: channel voltage As seen from the formula (11), $V_C > 0$ if there exists a potential in the source 602 or the drain 603. As a result, the charges in the depletion layer under the gate 605 are reduced and the threshold voltage is lowered. It is also seen from the formula (11) that the substrate bias voltage $V_B(<0)$ which is frequently used in the MOS d-RAM is a cause to lower $V_T$. (See H. C. Poon et al, 1973 IEDM Technical Digest p. 156).

The punch-through causes the reduction of the potential barrier which separates the source 602 and the drain 603 and permits the diffusion current to flow more easily. When the drain voltage is applied, the depletion layer of the drain spreads and the potential barrier is further lowered. This is shown in FIG. 6 (b), which shows the surface potential distribution at a constant gate voltage ($V_G = 1.8$ V) and with variable channel length and drain voltage. In a curve A, L=6.25 μm and $V_{DS}=0.5$ V, in a curve B, L=1.25 μm and $V_{DS}=0.5$ V, and in a curve C, L=1.25 μm and $V_{DS}=5$ V.

The punch-through which raises a problem as the channel of the CMOS is shortened is also a problem to be resolved in the insulated gate type SIT, but a proposal to principally prevent the punch-through has not been made so far.

The problems to be solved in conjunction with the prior art insulated gate type SIT and the application thereof to the complementary circuit are summarized as follows:

[1] Elimination of punch-through;
[2] Elimination of hot carriers;
[3] Obtaining saturation characteristic without increasing $r_s$; that is, without depending on the feedback effect; and
[4] Latch-up in the complementary circuit.

SUMMARY OF THE INVENTION

It is an object of the present invention to provide a punch-through free and hot carrier free non-saturation characteristic insulated gate type SIT.

High concentration source and drain regions of one conductivity type are formed in a low concentration channel region of the same conductivity type, and a region of the opposite conductivity type is formed to surround the low concentration channel region. Thus, the low concentration channel region is perfectly depleted and a neutral region will not be formed in the channel region under a gate electrode or in a vicinity thereof even if the voltage of the gate electrode changes.

It is another object of the present invention to provide a saturation characteristic insulated gate type SIT which does not depends on a negative feedback effect.

An electrostatic shield region is formed between a gate and a drain to meet a static shield condition.

It is still another object of the present invention to provide a latch-up free CMOS structure.

DESCRIPTION OF THE PREFERRED EMBODIMENTS

Figure 1A:
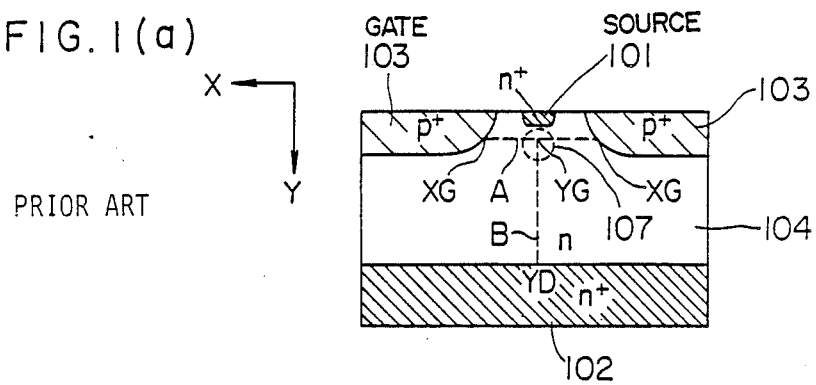
FIG. 1 (a) shows a sectional view of a prior art junction gate type vertical SIT,
FIG. 1 (b) shows saddle-shaped potential barrier,
FIG. 1 (c) shows a potential distribution,
FIGS. 1 (d) and 1 (e) are sectional views showing distribution of a depletion layer,
FIG. 2 (a) is a sectional view showing the distribution of an inversion layer and a depletion layer of a prior art lateral MOS-SIT,
FIG. 2 (b) is a sectional view showing generation of punch-through,
FIG. 3 (a) is a sectional view of an inverter which uses a prior art CMOS-FET,
FIGS. 3 (b)-3 (e) show equivalent circuits used to explain various operations.
Figure 1B:
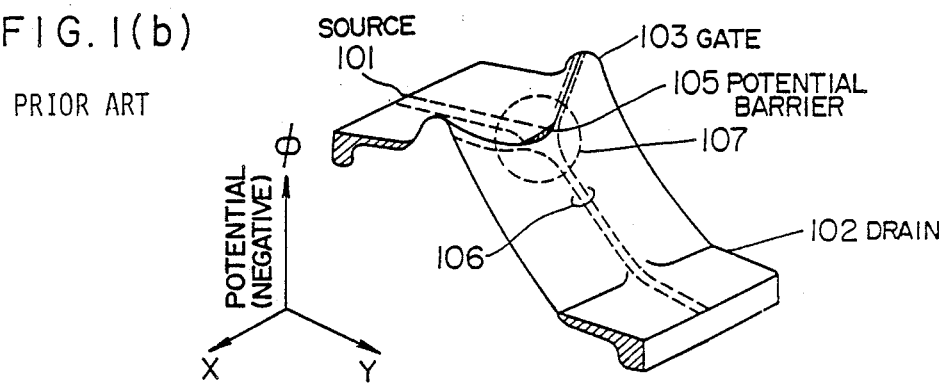
Figure 1C:
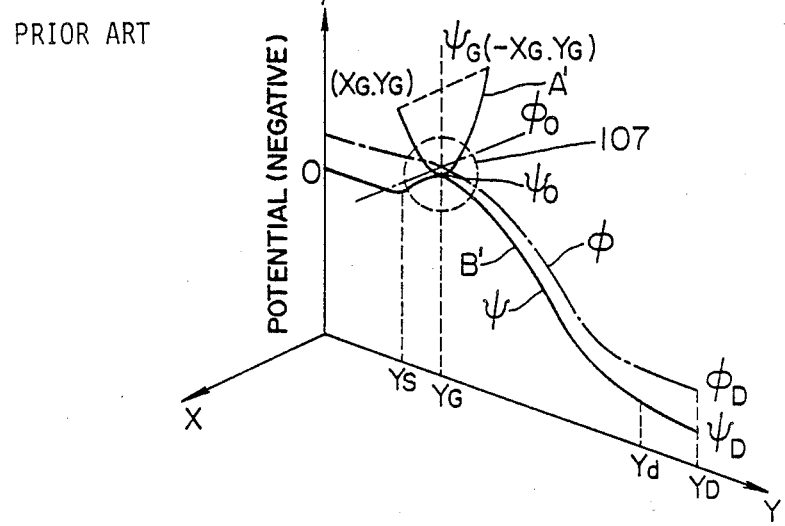
Figure 1D:
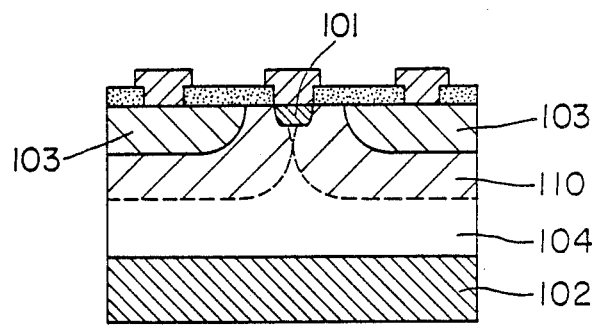
Figure 1E:
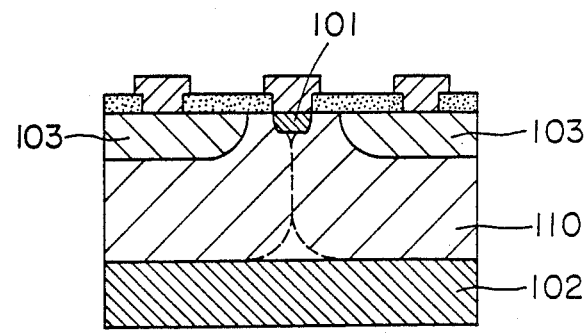
Figure 2A:
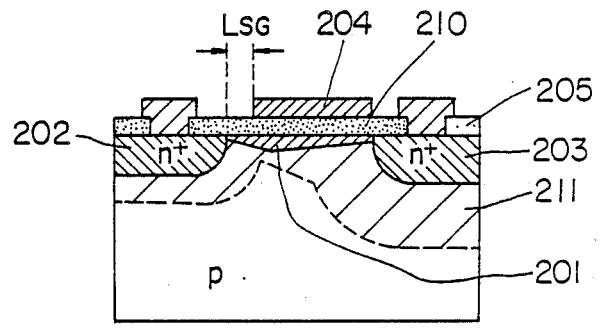
Figure 2B:
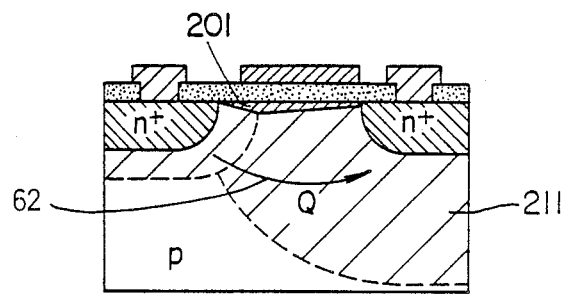
Figure 3A:
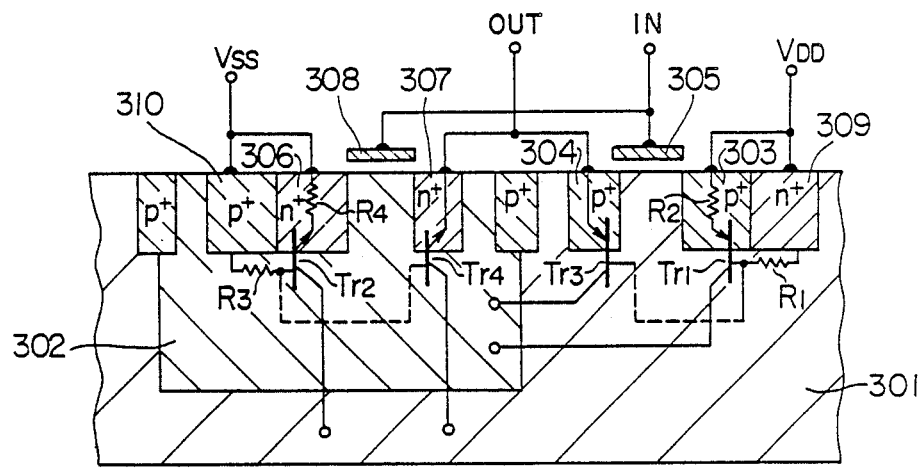
Figure 3B:
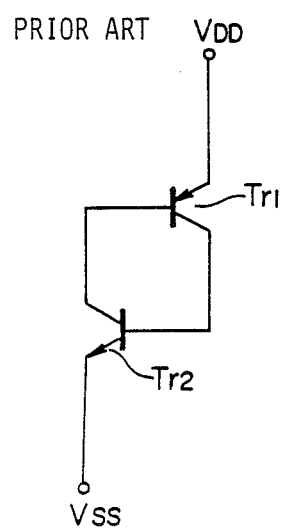
Figure 3C:
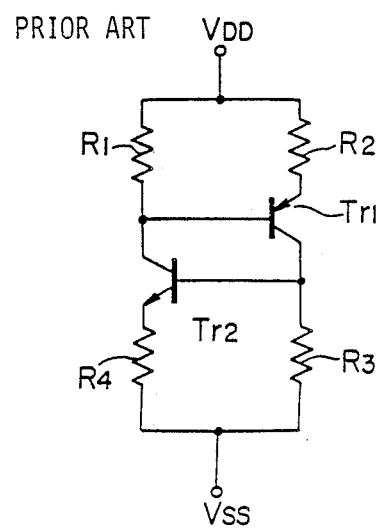
Figure 3D:
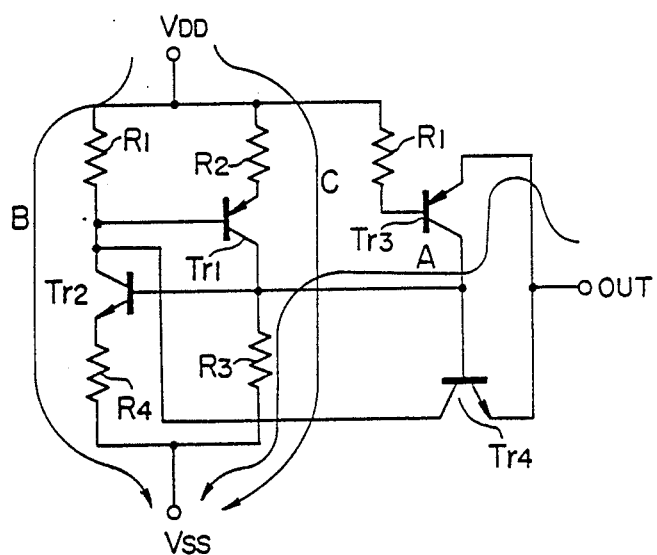
Figure 3E:
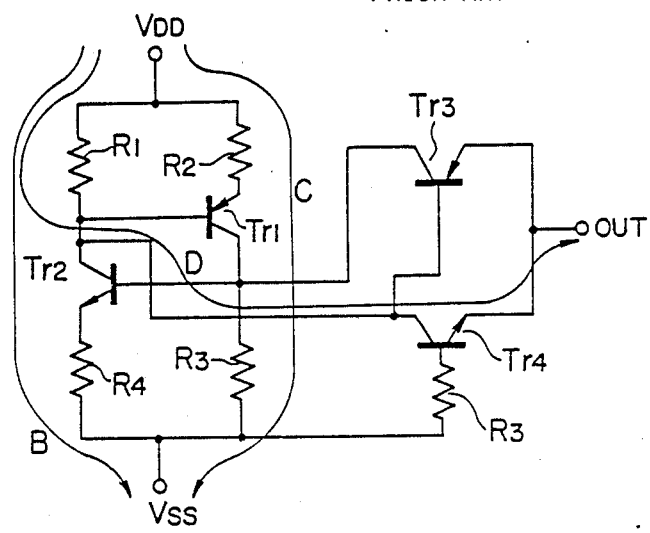
Figure 4:
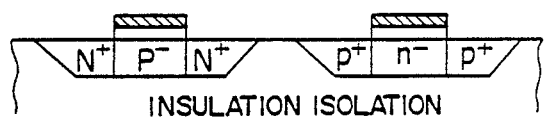
FIG. 4 shows CMOS sectional views corresponding to Table 1, FIG. 5 (a) is a model chart showing the process of hot carrier generation and breakdown voltage fall in a microminiaturized MOSFET, FIG. 5 (b) shows an equivalent circuit, FIG. 6 (a) is a model chart showing a process of V full and punch-through generation in a microminiaturized short-channel MOSFET, FIG. 6 (b) show a channel potential distribution, FIG. 7 (a) is a top view of a BC-MOS-SIT in accordance with one embodiment of the present invention, FIG. 7 (b) is a sectional view along the line A—A' of FIG. 7 (a), FIG. 7 (c) is a sectional view along the line C—C' of FIG. 7 (d), FIGS. 7 (d) and 7 (e) are sectional views along a channel for showing longitudinal distribution of a depletion layer, FIGS. 7 (f)-7 (i) show energy bands for various gate voltages, FIG. 7 (j) is a top view of a modification of FIG. 7 (a), FIG. 8 (a) is a top view of the BC-MOS-SIT having a gate electrode graved, FIG. 8 (b) is sectional view along the line A—A' of FIG. 8 (a), FIG. 8 (c) is a sectional view along the line B—B' of FIG. 8 (a), FIGS. 8 (d) and 8 (e) show high concentration channel stops formed in the vicinity of the channel under the gate electrode, FIG. 9 (a) is a top view of an ISIS-SIT in accordance with an embodiment of the present invention, FIG. 9 (b) is a sectional view along the line A—A' of FIG. 9 (a), FIG. 9 (c) is a sectional view along the line B—B' of FIG. 9 (a), FIG. 9 (d) is a sectional view along the line C—C' of FIG. 9 (a), FIG. 9 (e) shows an equivalent circuit symbol, FIGS. 9 (f) and 9 (g) are sectional views along a channel for showing longitudinal distribution of a depletion layer, FIG. 9 (h) is a top view of a modification of FIG. 9 (a), FIG. 9 (i) is a sectional view of a modification of FIG. 9 (b), FIGS. 9 (j) -9 (l) show energy bands along E—E' of FIGS. 9 (f) and 9 (g) for various gate voltages, FIG. 9 (m) shows an energy band along D—D' of FIG. 9 (b), FIG. 10 (a) shows an energy band in a thermal equilibrium condition for the embodiment of FIG. 9 (a), FIG. 10 (b) shows an energy band in an operational condition, FIG. 11 (a) shows a top view of an ISIS-SIT in accordance with another embodiment of the present invention, FIG. 11 (b) is sectional view along the line A—A' of FIG. 11 (a), FIG. 11 (c) is sectional view along the line B—B' of FIG. 11 (b), FIG. 11 (d) is a sectional view along the line C—C' of FIG. 11 (c), FIG. 11 (e) shows an equivalent circuit symbol, FIGS. 11 (f) and 11 (g) show top views of modifications of FIG. 11 (a), FIG. 12 (a) is a plan view of a CBCM-SIT inverter in accordance with still another embodiment of the present invention, FIG. 12 (b) is a sectional view along the line A—A' of FIG. 12 (a), FIG. 12 (c) shows the distribution of a depletion layer and neutral region, FIGS. 12 (d) and 12 (e) are a plan view and a sectional view along the line A—A' of FIG. 12 (a) for showing a channel stopper in a well of FIGS. 12 (a) and 12 (b) being moved out, FIGS. 12 (f) and 12 (g) are sectional views for showing the parasitic transistors of FIGS. 12 (b) and 12 (e), FIG. 12 (h) shows a circuit diagram of the parasitic transistors of FIGS. 12 (f) and 12 (g), FIGS. 13 (a) and 13 (b) show energy bands along lines B—B' and C—C' of FIGS. 12 (b) and 12 (e), FIGS. 14 (a) and 14 (b) show double-well structures for FIGS. 12 (b) and 12 (e), FIGS. 15 (a) and 15 (b) are a plan view and a sectional view along the line A—A' of FIG. 15 (a) respectively of a CBCM-SIT inverter in accordance with a further embodiment of the present invention, and FIGS. 16 (a) and 16 (b) show potential distributions along lines E—E' and D—D' of FIG. 15 (b).
Figure 5A:
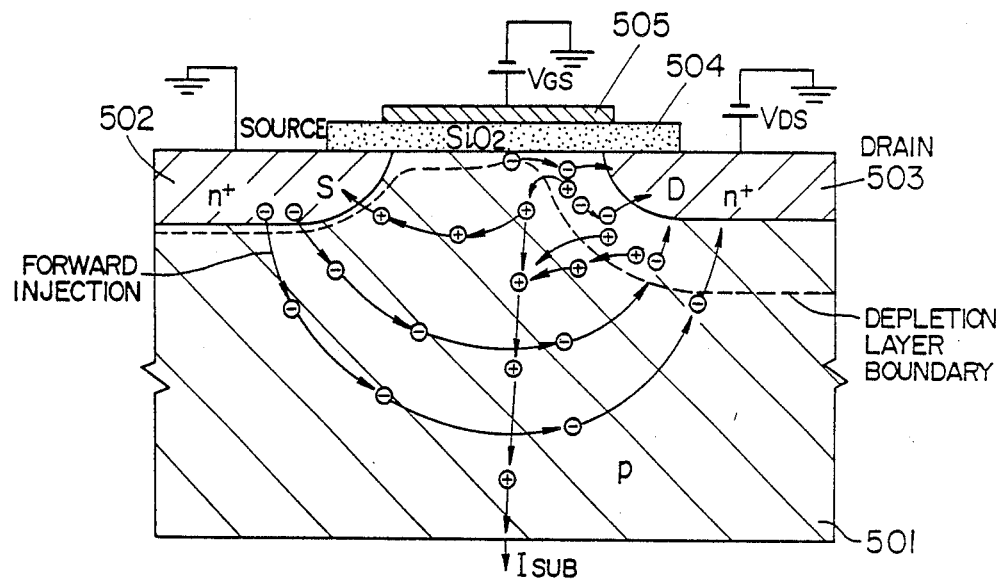
Figure 5B:
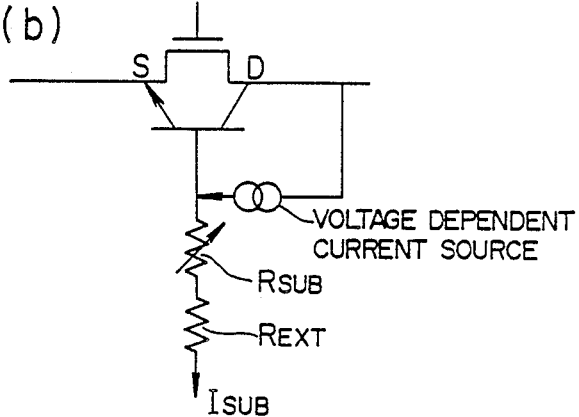
Figure 6A:
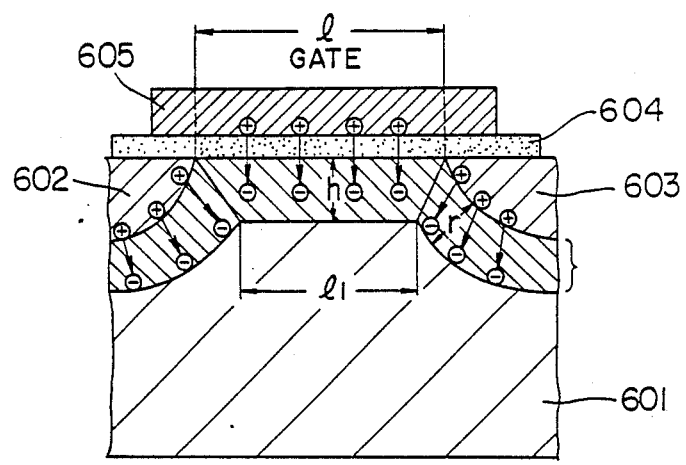
Figure 6B:
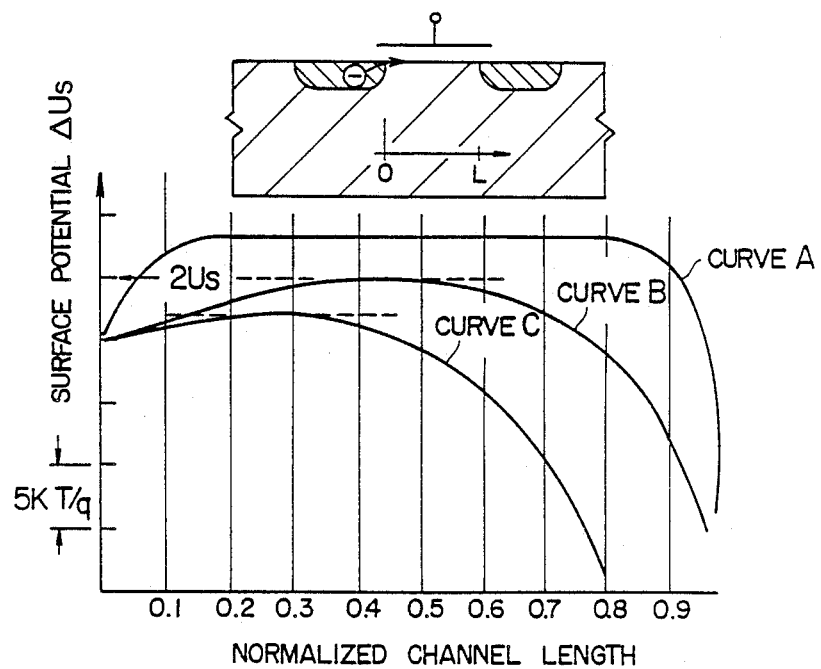
Figure 7A:
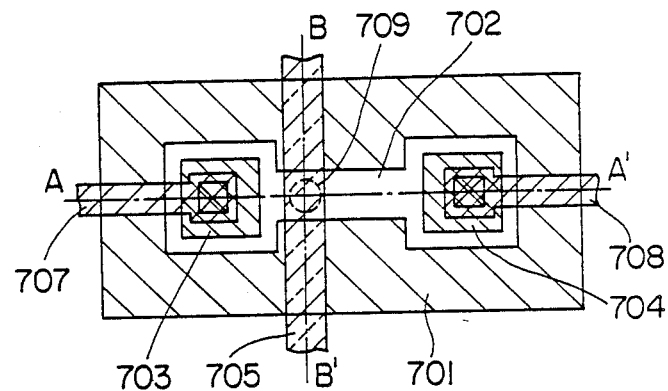
Figure 7B:
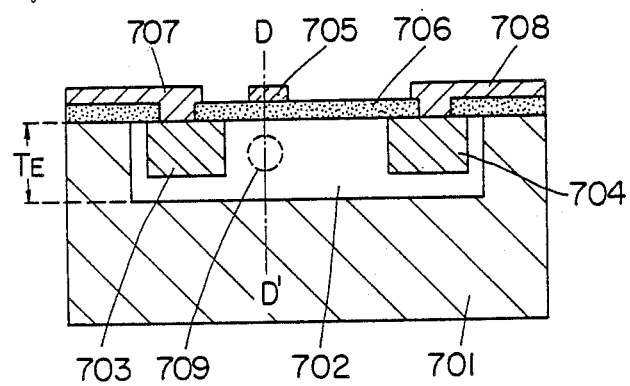
Figure 7C:
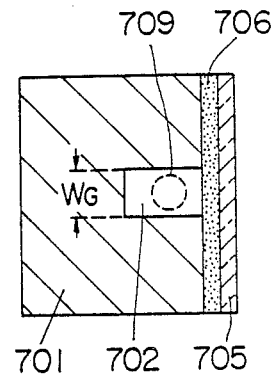
Figure 7D:
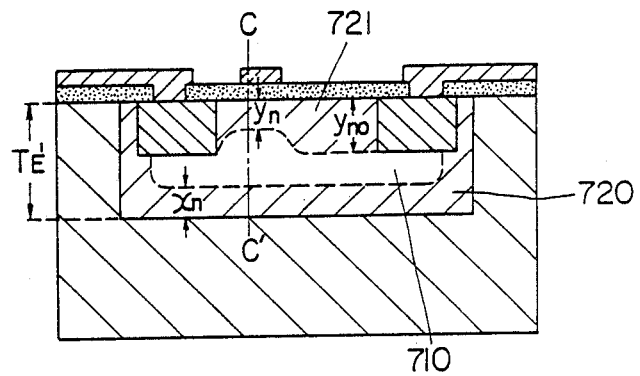
Figure 7E:
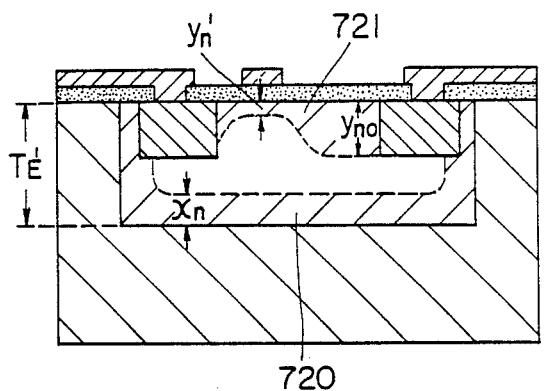
Figure 7F:
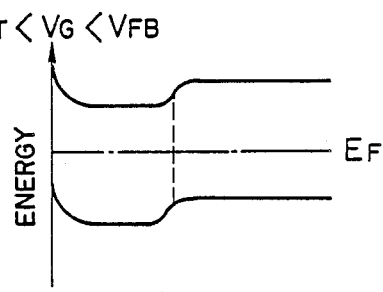
Figure 7G:
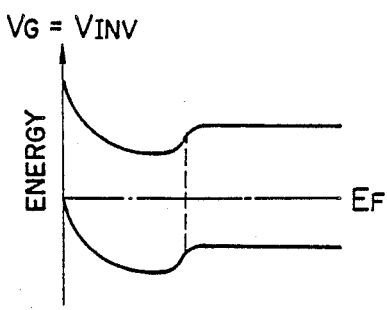
Figure 7H:
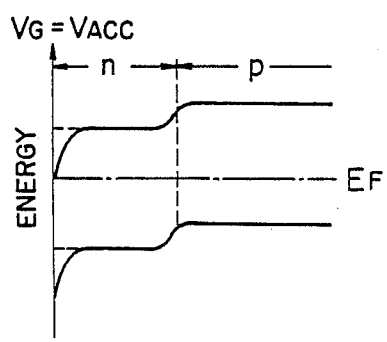
Figure 7I:
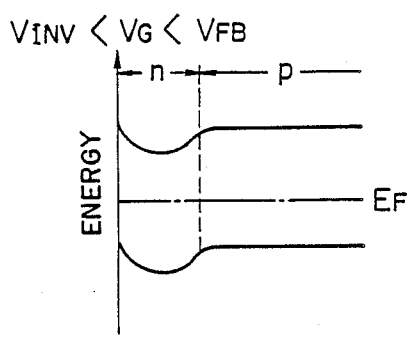
Figure 7J:
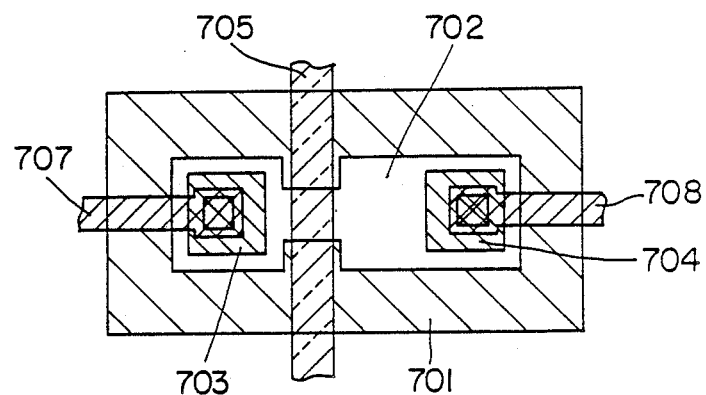
Figure 8A:
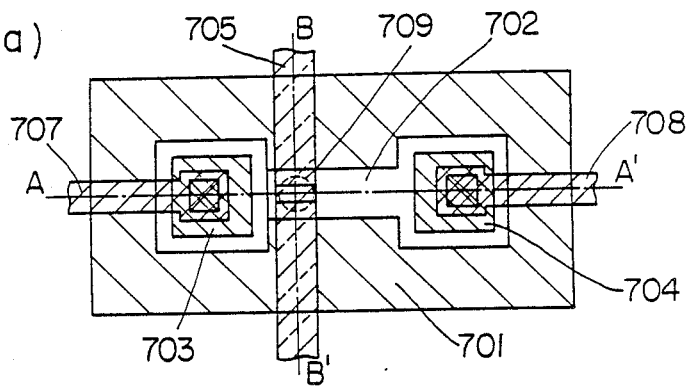
Figure 8B:
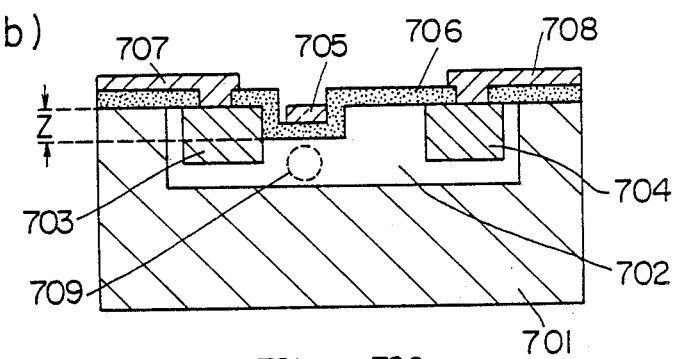
Figure 8C:
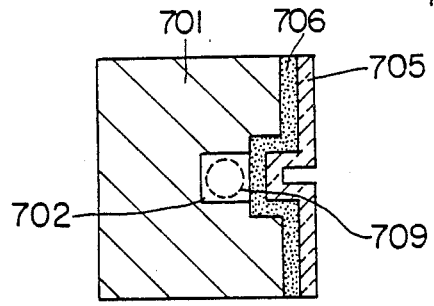
Figure 8D:
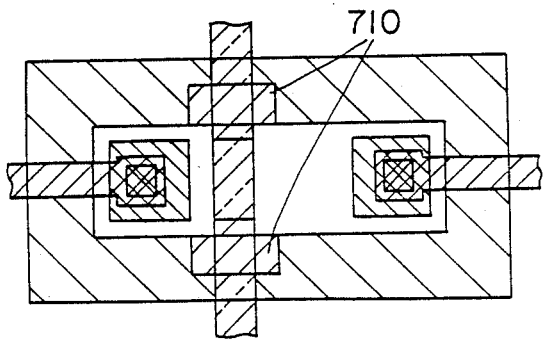
Figure 8E:
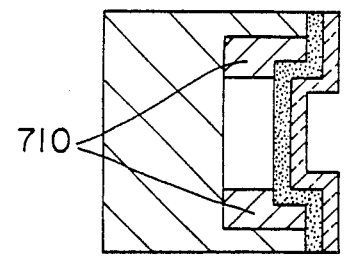
Figure 9A:
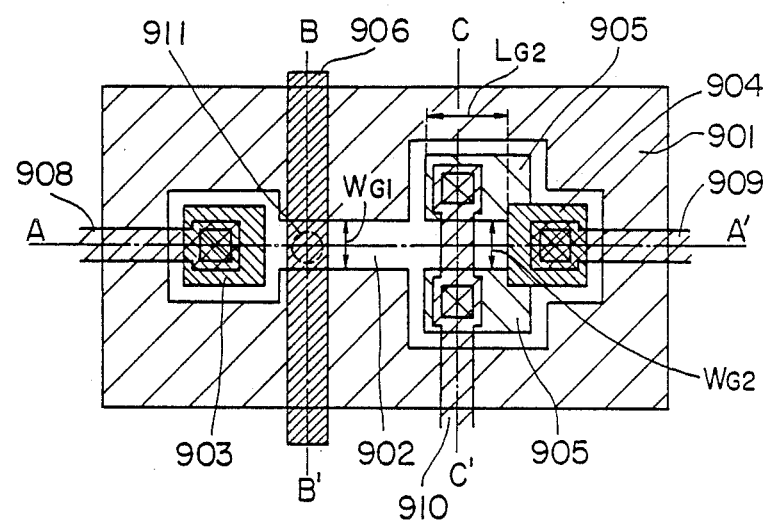
Figure 9B:
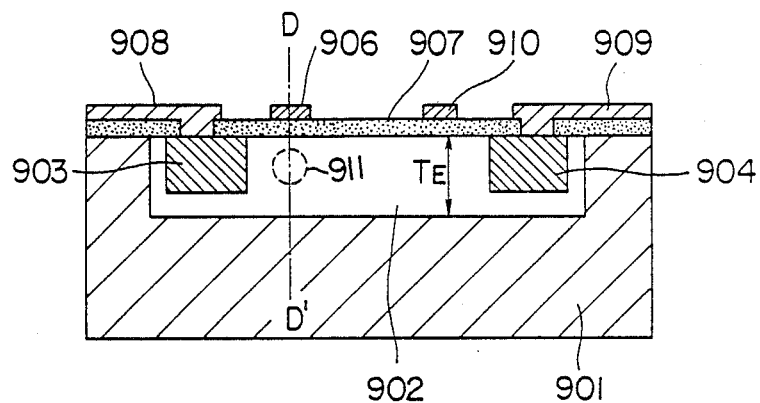
Figure 9C:
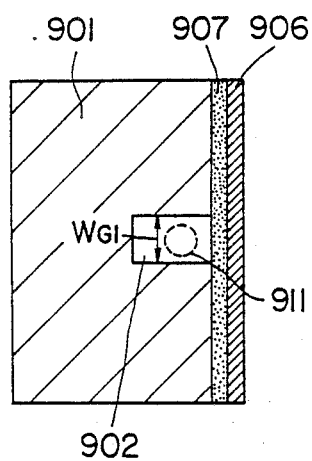
Figure 9D:
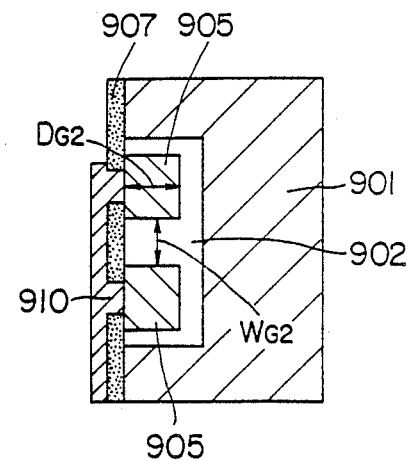
Figure 9E:
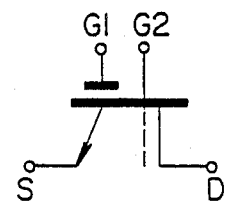
Figure 9F:
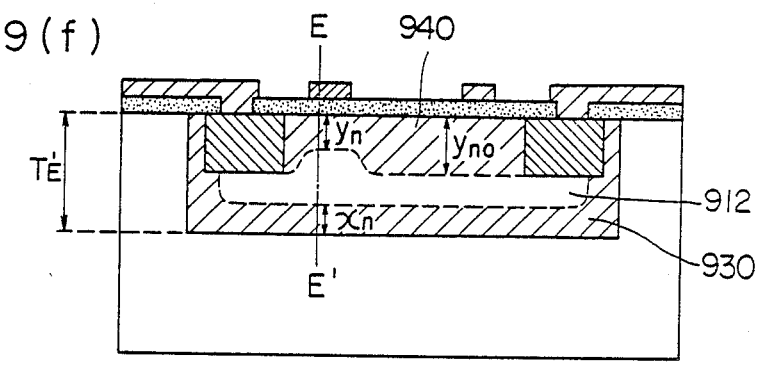
Figure 9G:
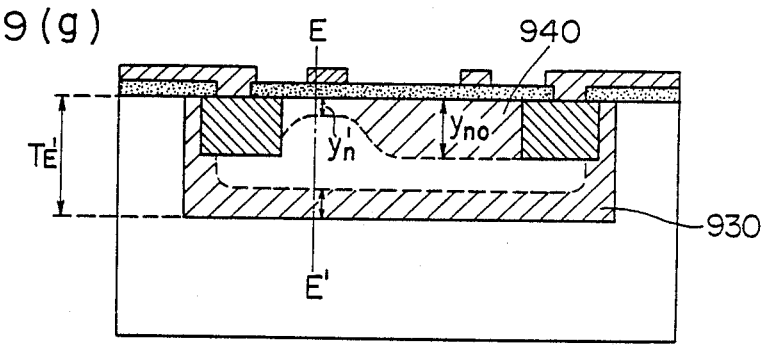
Figure 9H:
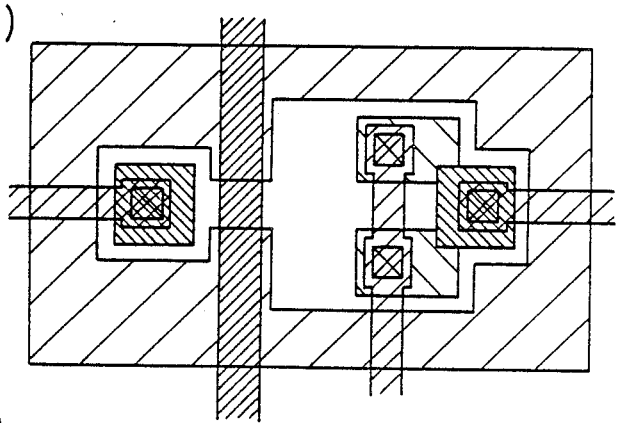
Figure 9I:
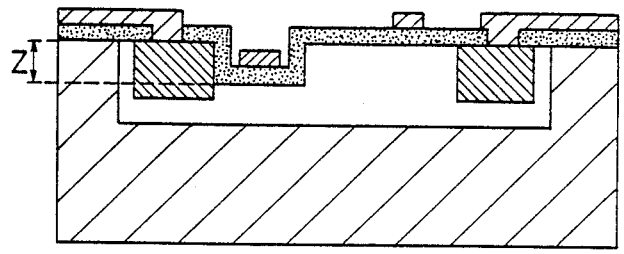

As a first embodiment of the present invention, an insulated gate type SIT having a perpectly depleted buried channel which encloses source and drain region will be described. Such an SIT is hereinafter called an ideal buried channel MOS-SIT (IBCM-SIT).

STRUCTURAL CHARACTERISTIC (A) A source $n^+$ region and a drain $n^+$ region are formed in an n region which forms a buried channel. The n region is surrounded by a p region and perfectly depleted. Since this depletion layer is not caused by the drain region and a drain voltage, there is no punch-through. Since the source and drain $n^+$ regions are formed in the buried channel n region of the same conductivity type, no hot carrier is generated.

(B) No neutral region is formed in the buried channel n region by a change of a voltage of an insulated gate electrode.

FIG. 7 (a) shows a top view of a lateral IBCM-SIT, FIG. 7 (b) is an A—A' sectional view along a channel, FIG. 7 (c) is a B—B' sectional view transverse to the channel, and FIGS. 7 (d) and 7 (e) are A—A' sectional views for showing a lateral depletion layer when an n-epi (or n well) layer has a depth of $T_E'$ (which is larger than $T_E$ in FIG. 7 (b)).

In FIGS. 7 (a) -7 (e), a device isolation p layer is formed in an n-epi layer formed on a substrate 701 (impurity concentration $N = 10^{12} \sim 10^{17}$ cm$^{-3}$), or an n well is formed on the p substrate 701 to form a channel n region 702. A source $n^+$ region 703 ($N = 10^{17} - 10^{20}$ cm$^{-3}$) and a drain $n^+$ region 704 ($N = 10^{17} - 10^{20}$ cm$^{-3}$) are formed in the n region 702, and a gate electrode 705 is formed on an insulation layer 706 on the channel in the vicinity of the source region and a source electrode 707 and a drain electrode 708 are contacted to the corresponding regions through contact windows of the insulation layer 706. The circle 709 in FIGS. 7 (a) -7 (c) indicates a region in which a saddle-shaped potential barrier exists. It is hereinafter called an intrinsic gate region 709.

The channel width $W_G$ (FIG. 7 (c)) is $$W_G \leq 2X_n \tag{12}$$

where $x_n$ is the thickness of a depletion layer 720 of the n region 702 which is adjacent to the p substrate 701 (or a device isolation p region when a p substrate having an n-epi layer formed therein is used. For the sake of simplicity, it is assumed that the n well is used.) The shorter $W_G$ is, the deeper is the lateral pinch-off. As a result, the enhancement mode is enhanced to a greater degree and the voltage amplification factor $\mu = \partial V_D/\partial V_G$ ($V_D$: drain voltage, $V_G$: gate voltage) increases. The channel width $W_G$ must not be smaller than the region 106 shown in FIG. 1 (b) in which the current concentrates.

The channel depth $T_E$ (FIG. 7 (b)) (which is an epi layer thickness or a well depth) must meet a longitudinal allowable condition for a reach-through.

The condition is derived from FIGS. 7 (d) and 7 (e). FIG. 7 (d) shows a spread of a longitudinal depletion layer 721 of thickness $y_n$ and a longitudinal depletion layer 720 of thickness $x_n$ of the n region adjacent to the p substrate when the channel depth is $T_E'$ and the gate voltage $V_G$ is represented by $$V_{INV} < V_G < V_{TH} \tag{13}$$

where $V_{INV}$: voltage at which the channel surface inverts to p type $V_{TH}$: threshold voltage (voltage at which a neutral region for a conduction condition for the channel is formed at $V_D \simeq 0$)

$T_E'$ is shown in an enlarged scale to illustrate the neutral region 710. In FIG. 7 (b), if the channel depth $T_E$ meets $$T_E < x_n + y_n < T_E' \tag{14}$$

perfect pinch-off is established. This is also a condition in which the neutral region is not created.

Since the gate electrode 705 exits only in the vicinity of the source, the depletion layer 721 having a thickness $y_{no}$ of the channel spaced from the gate electrode spreads more than the depletion layer $y_n$ under the gate electrode.

FIG. 7 (f) shows an energy band along the C—C' section of FIG. 7 (d) for the condition of the formula (13). (An energy band for $V_G = V_{INV}$ is shown in FIG. 7 (g).)

FIG. 7 (e) shows a spread of the depletion layer 721 of thickness $y_n'$ and the depletion layer 720 of thickness $x_n$ of the n region adjacent to the p substrate when the channel depth is $T_E'$ and the gate voltage $V_G$ meets $$V_{TH} < V_G < V_{FB} \tag{15}$$

where $V_{FB}$: flat band voltage (a voltage at which there is no curvature on a band surface and the neutral region reaches the surface)

As seen from FIG. 7 (e), as the gate voltage increases, the depletion layer 721 of thickness $y_n'$ under the gate electrode spreads less than $y_n$ in FIG. 7 (d). The depletion layer $y_{no}$ of the channel distant from the gate electrode spreads equally to $y_n$.

In order to attain the perfect pinch-off under operating conditions, it is necessary that $T_E$ of FIG. 7 (b) meets the following neutral region condition.

$$T_E \leq x_n + y_n' \leq x_n + y_n < T_E' \tag{16}$$

where $y_n$ (and $y_n'$) are generally given by $$y_n \approx -\frac{t_{ox}}{\epsilon_{ox}} \cdot \epsilon_s + \sqrt{\left(\frac{t_{ox}}{\epsilon_{ox}} \cdot \epsilon_s\right)^2 - 2 \cdot \frac{\epsilon_s}{qN}(V_G - V_{FB})} \tag{17}$$

(The presence of the formula (17) is permitted by the conditions of the formulas (13) and (15)) where $\epsilon_{ox}$: dielectric constant of insulation layer
$\epsilon_s$: dielectric constant of channel
$t_{ox}$: thickness of insulation layer
N: impurity concentration of channel Since $y_n$ (and $y_n'$) *changes depending on* $V_G$, it is not desirable to consider it as a major parameter which determines a condition to attain the reach-through.

On the other hand, the depletion layer $y_{no}$ which is little dependent on the gate voltage $V_G$ corresponds to a case where $V_G = 0$ in the formula (17) and it is represented as follows.

$$y_{no} \approx -\frac{t_{ox}}{\epsilon_{ox}} \cdot \epsilon_s + \sqrt{\left(\frac{t_{ox}}{ox} \cdot \epsilon_s\right)^2 + 2 \cdot \frac{\epsilon_s}{qN} V_{FB}} \tag{18}$$

Accordingly, the necessary condition for reach-through which causes the pinch-off is $$T_E \leq x_n + y_{no} \tag{19}$$

Since there is a possibility that the neutral region is present under the gate electrode, the sufficient condition for reach-through is that the formula (12) is met laterally and the formula (16) is met longitudinally. The $y_n$ and $y_n'$ in the formula (16) approach zero as $V_G$ approaches $V_{FB}$, as seen from the formula (17), and the longitudinal sufficient condition is given by setting y and $y_n'$ to zero in the formula (15), that is, $$T_E \leq x_n \tag{20}$$

The necessary and sufficient condition for the reach-through is that only the formula (12) is met as seen from the formulas (12), (19) and (20), and it is independent of the longitudinal condition. In other words, the channel depth need not be considered as the condition for reach-through. From the formula (19), it is seen that if the formula (19) is met as the longitudinal condition, the formula (12) need be met only for the channel under the gate electrode as the lateral condition. Namely, in the layout of FIG. 7 (a), it is sufficient that the channel is narrowed in accordance with the formula (12) only under the gate electrode, as shown in FIG. 7 (j).

Alternatively, in order to relieve the lateral condition under the gate electode, a trench may be formed under the gate electrode as shown in FIGS. 8 (a)–8 (c). When the depth of the trench is Z, the condition for the gate width $W_G$ is represented by $$W_G < 2x_n - Z \tag{21}$$

In order to further relieve the condition for $W_G$, a high concentration channel stop region 710 may be formed in the vicinity of the channel under the gate electrode as shown in FIGS. 8 (d) and 8 (e). This may also be applied to FIG. 7.

The conditions for the reach-through are summarized in Table 2.

TABLE 2

| Groove | Channel under gate electrode | Channel between gate electrode and drain | Remarks |
|---|---|---|---|
| No | $W_G < 2x_n$ ... (12) | $W_G < 2x_n$ ... (12) | ↓ Condition |
|  |  | any $T_E$ | ↓ to |
|  | $W_G < 2x_n$ ... (12) | any $W_G$ | ↓ channel |
|  |  | $T_E \leq x_n + y_{no}$ ... (19) | ↓ width |
|  |  |  | ↓ is re- |
| Yes | $W_G < 2x_n - z$ ... (21) | any $W_G$ | ↓ lieved |
|  |  | $T_E \leq x_n + y_{no}$ ... (19) |  |

From the formulas (13) and (14), the allowable range of the gate voltage $V_G$ is $$V_{INV} < V_G < V_{FB} \tag{22}$$

The energy band of the D—D' section in FIG. 7 (b) under this condition is shown in FIG. 7 (i).

If $V_G > V_{FB}$, a surface channel is formed and most currents flow through the surface channel for $V_G$ which is larger than a voltage $V_{ACC}$ at which a storage layer is formed on the surface. The energy band for $V_G = V_{ACC}$ is shown in FIG. 7 (h).

In accordance with the present embodiment,
[1] punch-through, and
[2] hot carriers
of the problems described above are principally resolved. The stable reach-through condition is clarified and the ideal buried channel is formed. When a multichannel structure is used, the current capacity is increased.

As a second embodiment of the present invention, and IBCM-SIT having an electrostatic shield region (which is hereinafter called an ideal saturated operation by insulated and shielding gate-SIT (ISIS-SIT)) is explained.

The structural characteristic is, in addition to the characteristics (A) and (B) described in connection with the IBCM-SIT, (C) an electrostatic shield region is formed to prevent a potential change of the drain region from affecting to the intrinsic gate region.

FIG. 9 (a) is a top view of the lateral ISIS-SIT, FIG. 9 (b) is an A—A' sectional view along a channel, FIG. 9 (c) is a B—B' sectional view transverse to the channel, FIG. 9 (d) is a C—C' sectional view transverse to the channel, and FIG. 9 (e) shows an equivalent circuit symbol.

In FIG. 9, a device isolation p layer is formed in an n-epi layer formed on a p substrate 901 (impurity concentration $N = 10^{12} - 10^{17}$ cm$^{-3}$) or an n well is formed on the p substrate 901 to form a channel n region 902 ($N = 10^{12} - 10^{17}$ cm$^{-3}$). A source n+ region 903 ($N = 10^{17} - 10^{20}$ cm$^{-3}$), a drain n+ region 904 ($N = 10^{17} - 10^{20}$ cm$^{-3}$) and a shield gate (or second gate) region 905 ($N = 10^{17} - 10^{20}$ cm$^{-3}$) are formed in the n region 902, and a control gate (or first gate) electrode 906 is formed on an insulation layer 907 on a channel in the vicinity of the source region. A source electrode 908, a drain electrode 909 and a shield gate electrode 910 are contacted to the corresponding regions through contact windows of the insulation layer 907. A circle 911 in FIG. 9 represents a region in which a saddle-shaped potential barrier exists. It is hereinafter called an intrinsic gate region 911 (which performs real control gate operation).

A channel width $W_{G1}$ of FIG. 9 (c) is given by $$W_{G1} \leq 2x_n \tag{22}$$

where $x_n$ is a depletion layer of the n region 902 adjacent to the p substrate 901 (or the device isolation p region when a p substrate having an n-epi layer formed therein is used. For the sake of simplicity, it is assumed that the n well is used.)

On the other hand, the channel depth $T_E$ of FIG. 9 (b) (which is also a thickness of the n-epi layer or a depth of n well) must also meet a longitudinal allowable condition for the reach-through.

The condition is derived from FIGS. 9 (f) and 9 (g). In FIGS. 9 (f) and 9 (g), the channel depth $T_E' (> T_E)$ is shown in an enlarged scale to illustrate a change of the depletion layer and the neutral region 912 (FET other than SIT utilizes the neutral region but SIT does not). Numeral 930 denotes a depletion layer adjacent to the p substrate, and numeral 940 denotes a depletion layer adjacent to the insulation layer.

FIG. 9 (f) shows a depletion layer thickness $y_n$ which longitudinally spreads from the insulation layer and a depletion layer thickness $x_n$ of the n region 902 adjacent to the p substrate when the control gate voltage $V_G$ meets $$V_{INV} < V_G < V_{TH} \tag{23}$$

where
$V_{INV}$: voltage at which channel surface is inverted to p type
$V_{TH}$: threshold voltage (voltage at which neutral region is formed at $V_P \approx 0$)

In order for the channel depth $T_E$ of FIG. 9 (b) to meet the reach-through condition under the operating condition of the formula (23), $$T_E < x_n + y_n \ (<T_E') \tag{24}$$

Since the control gate electrode 906 is present only in the vicinity of the source, the depletion layer thickness $y_{no}$ of the channel distant from the control gate electrode 906 is larger than the depletion layer thickness $y_n$ under control gate electrode.

$$y_n < y_{no} \tag{25}$$

FIG. 9 (g) shows a depletion layer thickness $y_n'$ which vertically spreads from the insulation layer and the depletion layer thickness $x_n$ of the n region 902 adjacent to the p substrate when the control gate voltage $V_G$ meets $$V_{TH} < V_G < V_{FB} \tag{26}$$

where
$V_{FB}$: flat band voltage (voltage at which there is no curvature on a band)

As seen from FIG. 9 (g), as the control gate voltage increases, the depletion layer thickness $y_n'$ under the control gate electrode becomes smaller than $y_n$ in FIG. 9 (f). On the other hand, the depletion layer thickness $y_{no}$ of the channel distant from the control gate electrode is equal to $y_n$.

In order for the channel depth $T_E$ of FIG. 9 (b) to meet the reach-through condition under the operating condition of the formula (26), $$T_E < x_n + y_n' < x_n + y_n \tag{27}$$

The $y_n$ (and $y_{n'}$) are generally represented as follows $$y_n \approx -\frac{t_{ox}}{\epsilon_{ox}} \cdot \epsilon_s + \sqrt{\left(\frac{t_{ox}}{\epsilon_{ox}} \cdot \epsilon_s\right)^2 - 2 \cdot \frac{\epsilon_s}{qN}(V_G - V_{FS})} \quad (28)$$

(The presence of the formula (28) is permitted by the condition of the formulas (23) and (26)) where
$\epsilon_{ox}$: dielectric constant of insulation layer
$\epsilon_s$: dielectric constant of channel
$t_{ox}$: thickness of insulation layer
N: impurity concentration of channel Since $y_n$ (and $y_n'$) change depending on $V_G$, it is not desirable to consider it as a major parameter to determine the reach-through condition.

On the other hand, the depletion layer $y_{no}$ which is little dependent on the control gate voltage $V_G$ corresponds to a case where $V_G=0$ in the formula (28) and is represented by $$y_{no} \approx -\frac{t_{ox}}{\epsilon_{ox}} \cdot \epsilon_s + \sqrt{\left(\frac{t_{ox}}{\epsilon_{ox}} \cdot \epsilon_s\right)^2 + 2 \cdot \frac{\epsilon_s}{qN} \cdot V_{FB}} \quad (29)$$

A necessary condition for the reach-through which causes the pinch-off is $$T_E \leq x_n + y_{no} \quad (30)$$

in the area other than under the control gate electrode, but since there is a possibility that the neutral region is present under the control gate electrode, a sufficient condition for the reach-through is that the formula (22) is met laterally and the formula (10) is met longitudinally. The $y_n$ and $y_n'$ in the formula (27) approach zero as $V_G$ approaches $V_{FB}$ as seen from the formula (28). Thus, the longitidinal sufficient condition is given by setting y and $y_n'$ in the formula (27) to zero, that is, $$T_E \leq x_n \quad (31)$$

The necessary and sufficient condition for the reach-through is that only the formula (22) is met, as seen from the formulas (22), (30) and (31), and it does not depend on the longitudinal condition so long as the formula (22) is met. Namely, it is not necessary to consider the channel depth as the reach-through condition.

On the other hand, when the channel depth $T_E$ meets the formula (30), the reach-through condition is such that the formula (22) is met by the channel under the control gate electrode. Namely, in the layout of FIG. 9 (a), the channel is narrowed in accordance with the formula (22) only under the control gate electrode, as shown in FIG. 9 (h).

Alternatively, in order to relieve the lateral reach-through condition under the control gate electrode, a trench may be formed under the control gate electrode as shown in FIG. 9 (i).

When the depth of the trench is Z, the formula (31) is represented by $$T_E - Z \leq x_n \quad (32)$$

and if $T_E - Z = x_n$, the condition of the formula (22) is not necessary and the formula (30) is met in the channel other than under the control gate electrode.

From the formulas (23) and (26), the allowable range of the control gate voltage $V_G$ is given by $$V_{INV} < V_G < V_{FB} \quad (33)$$

FIG. 9 (j) shows an energy band along an E—E' section of FIGS. 9 (f) and 9 (g) under this condition.

When $V_G \geq V_{INV}$, the inversion layer is formed on the surface and holes are stored. Accordingly, it is not desirable. FIG. 9 (k) shows an energy band for $V_G = V_{INV}$. If $V_G < V_{FB}$, the surface channel is formed and most currents flow through the surface channel for $V_G$ which is larger than a voltage $V_{ACC}$ at which a storage layer is formed on the surface. FIG. 9 (l) shows an energy band for $V_G = V_{ACC}$.

FIG. 9 (m) shows an energy band along a D—D' section of FIG. 9 (b) for the condition of the formula (33). (It is seen from FIG. 9 (m) that there is no neutral region).

The design conditions for the control gate and the channel have been described. The shield region is now explained.

The shield gate region 905 functions to statically shield the propagation of the potential change of the drain n+ region 904 to the intrinsic gate region 911.

As shown in FIG. 9 (a), a pair of shield gate regions 905 are arranged on the opposite sides of the channel. If the channel width $W_{G2}$ determined by the shield gate region 905 is maintained over a length $L_{G2}$ and a depth $D_{G2}$, the static shield condition is given by $$L_{G2} > W_{G2} > T_E - D_{G2} \quad (34)$$

and the shield gate region 905 is reverse-baised to the drain $n^{30}$ region 904 in a sense of D.C. and grounded in a sense of A.C. In this manner, the influence of the potential change of the drain n+ region 904 to the potential barrier of the inherent gate region 911 is completely shielded.

As a result, the potential barrier of the intrinsic gate region 911 is controlled only by the static induction effect of the voltage applied to the control gate electrode 906 and it does not depends on the voltage applied to the control gate electrode 906 and it does not depends on the drain voltage because of the electrostatic shield effect of the shield gate region 905. Thus, an ideal saturation current characteristic is attained while a high gm of the non-saturation current characteristic SIT is maintained.

Figure 10A:
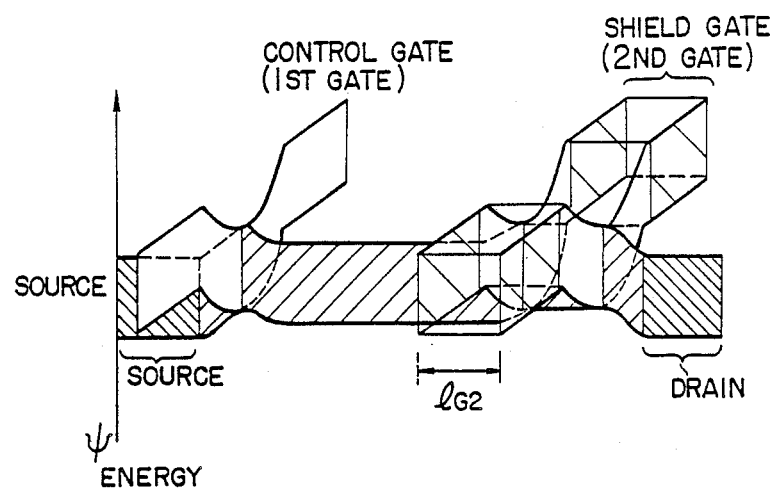
Figure 10B:
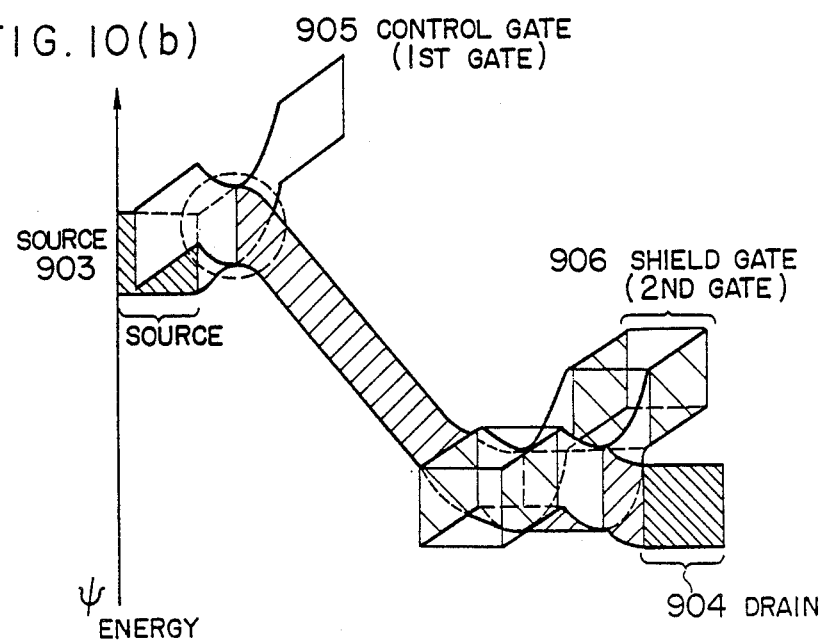

FIG. 10 (a) shows a thermal equilibrium condition of the energy band along A—A' and FIG. 10 (b) shows an operating condition thereof.

In accordance with the present embodiment,
[1] punch-through
[2] hot carriers, and
[3] saturation characteristic not due to $r_s$ negative feedback effect
of the problems to be resolved are resolved.

When a multi-channel structure is used, a higher current capacity can be attained.

Another embodiment of the present invention which attains the shield gate region function by using a high concentration channel stop is now explained.

Figure 11A:
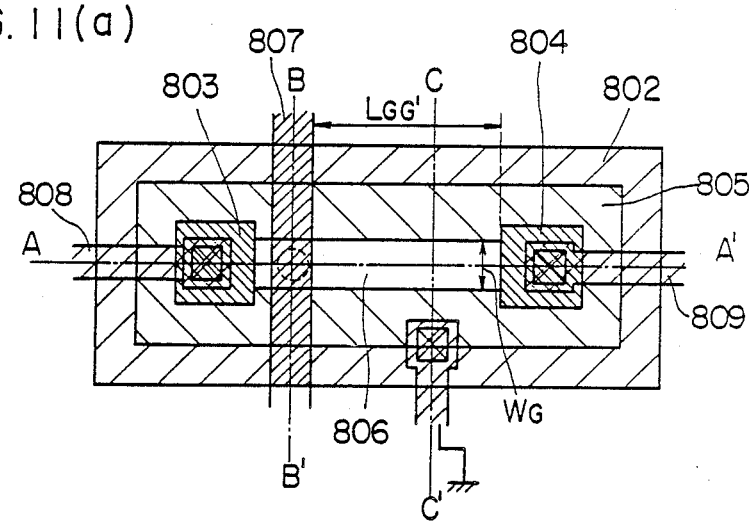
Figure 11B:
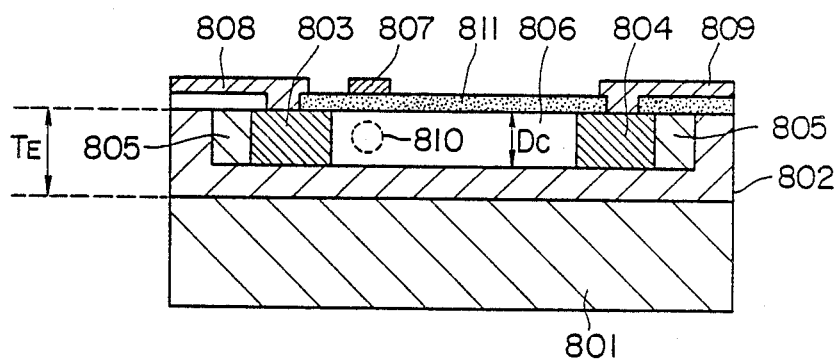
Figure 12A:
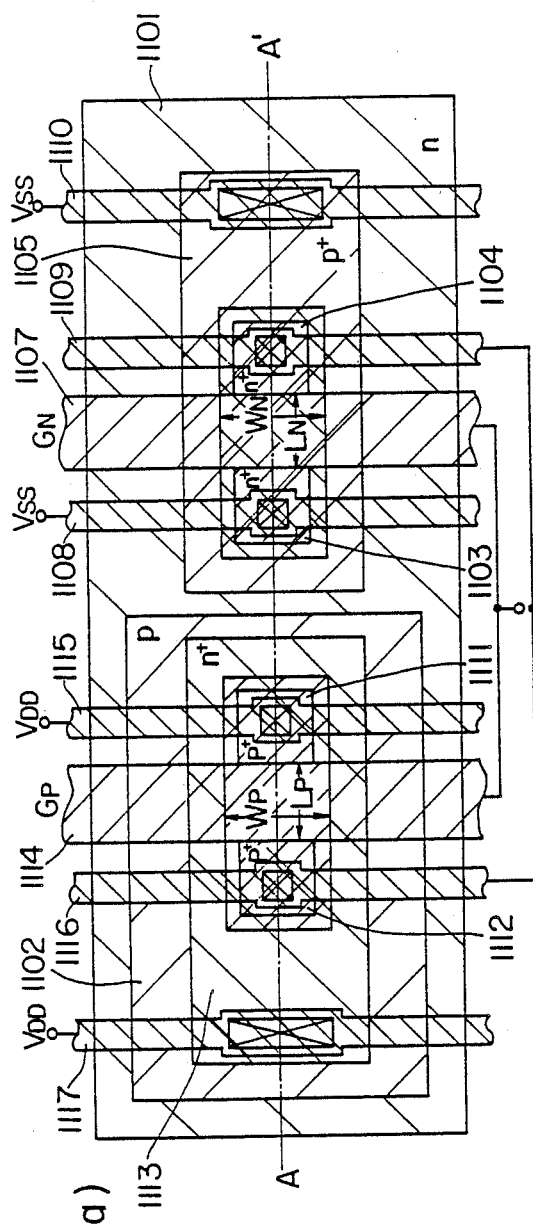
Figure 12B:
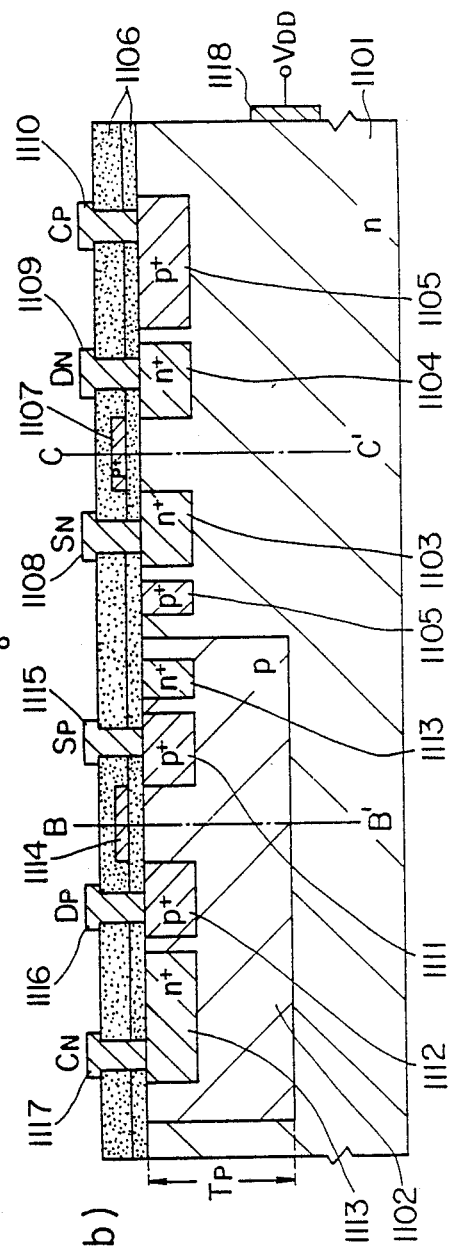
Figure 12C:
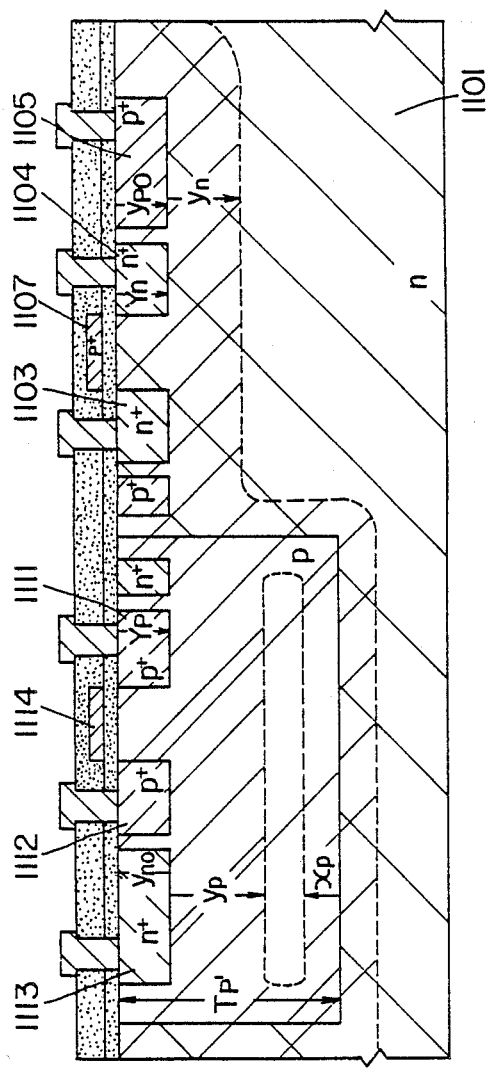
Figure 12D:
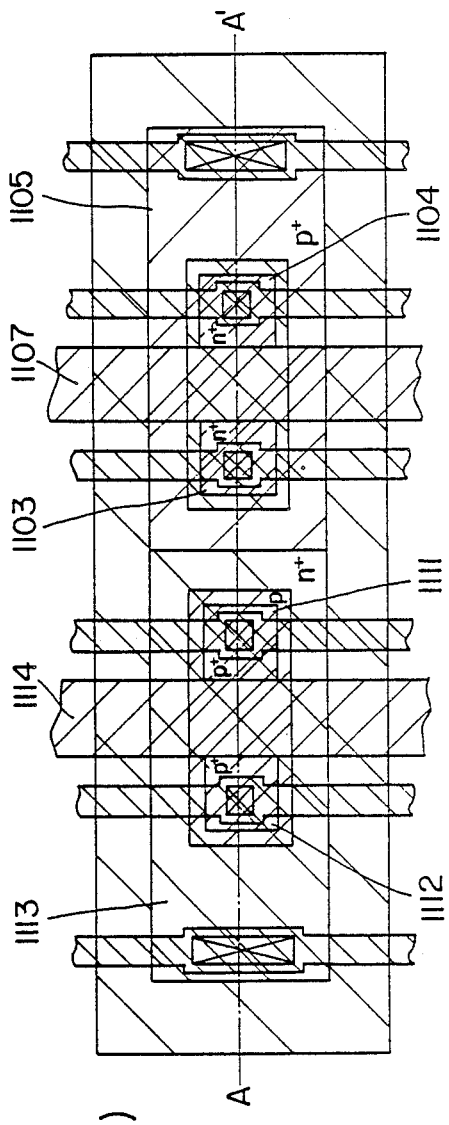
Figure 12H:
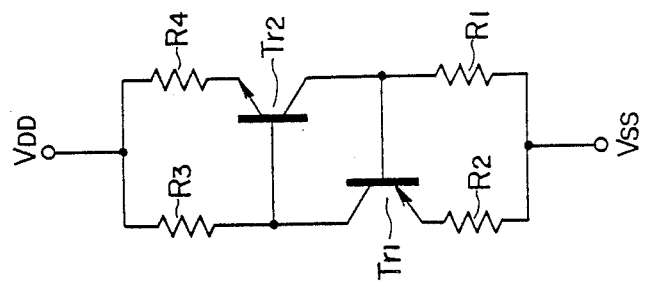
Figure 12E:
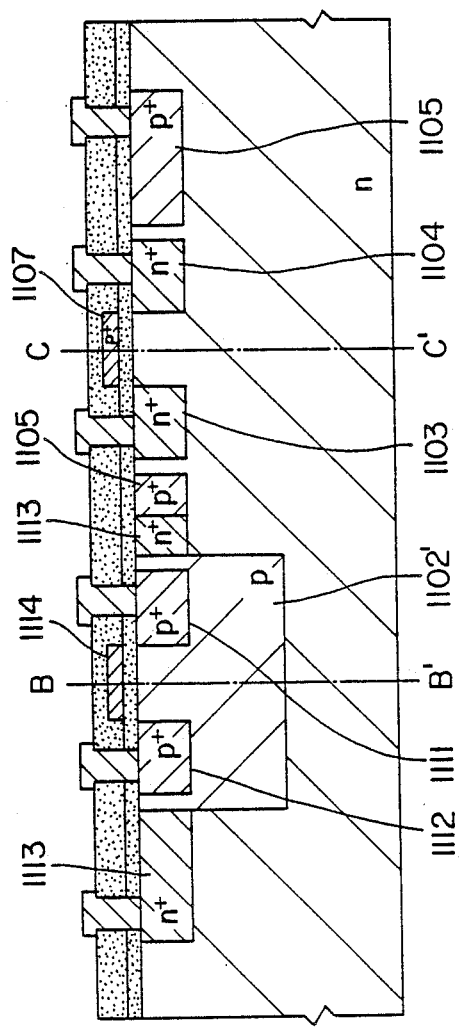

FIG. 11 (a) shows a top view of a lateral ISIS-SIT, FIG. 11 (b) shows an A—A' sectional view along a channel, FIG. 11 (c) shows a B—B' sectional view transverse to the channel, FIG. 11 (d) shows a C—C' sectional view transverse to the channel, and FIG. 11 (e) shows an equivalent circuit symbol.

In FIG. 11, a source n+ region 803 (N=$10^{17}$–$10^{20}$ cm$^{-3}$), a drain n+ region 804 (N=$10^{17}$–$10^{20}$ cm$^{-3}$), a channel n region 806 (N=$10^{12}$–$10^{17}$cm$^{-3}$) and a channel stop p+ region 805 (N=$10^{17}$–$10^{20}$ cm$^{-3}$) are formed on a surface of a p-epi region 802 (N=$10^{12}$–$10^{17}$ cm$^{-3}$) formed on a p+ substrate 801 (N=$10^{17}$–$10^{20}$ cm$^{-3}$), a control gate (or first gate) electrode 807 is formed on an insulation layer 811 on a channel in the vicinity of the source region, and a source electrode 808 and a drain electrode 809 are contacted to the corresponding regions through contact windows of the insulation layer 811. A circle 810 shows an intrinsic gate region.

A lateral condition for the reach-through for a channel width $W_G$ of the embodiment of FIG. 11 is given by $$W_G \leq 2x_m \tag{35}$$

where $x_m$ is the thickness of a depletion layer of the channel n region 806 adjacent to the channel stopper p+ region 805. As discussed in connection with FIG. 9, if the formula (35) is met, a condition for the channel depth is not necessary.

On the other hand, a longitudinal condition for the reach-through for the depletion layer $x_n$ of the channel n region 806 adjacent to the p-epi region 802 is given by $$D_C \leq x_n \tag{36}$$

where $D_C$ is the channel depth. If the formula (36) is met, the condition of the formula (35) is not necessary.

A condition for the electrostatic shield by the channel stop p+ region 805 is given by $$L_{GG'} > W_G > T_E - D_C \tag{37}$$

where $L_{GG'}$ is the channel length from the control gate electrode 807 to the drain n+ region 804 and $T_E$ is the thickness of the p-epi layer.

As a result, the potential barrier of the intrinsic gate region 810 is controlled only by the control gate electrode 807 and an ideal saturation current characteristic is attained while a high $g_m$ of a non-saturation current characteristic SIT is maintained by the electrostatic shield effect of the channel stop p+ region 805.

The layout of the channel stop may be modified in various ways. In FIG. 11 (f), the periphery of the drain is removed, and in FIG. 11 (g), the channel width around the drain is increased. The same effect is attained so long as the formula (37) is met.

In accordance with the present embodiment, the high concentration channel stop is formed around the channel to attain the static shield without forming the shield gate region. Thus, the ISIS-SIT which is advantageous in miniaturization is provided.

As a fourth embodiment of the present invention, a complementary structure which uses the IBCM-SIT or ISIS-SIT (hereinafter called a complementary buried channel MOS-SIT (CBCM-SIT) is explained.

The structural characteristics of the IBCM-SIT and ISIS-SIT used as a component of the complementary structure have (A)+(B) and (A)+(B)+(C), as described above.

FIGS. 12 (a) and 12 (b) show a plan view and an A—A' sectional view of a CBCM-SIT inverter which is suitable for high density and microminiaturization.

A p well region 1102 (N=$10^{12}$–$10^{17}$ cm$^{-3}$) is formed on an n substrate 1101 (N=$10^{12}$–$10^{17}$cm$^{-3}$). A source n+ region 1103 (N=$10^{17}$–$10^{20}$ cm$^{-3}$), a drain n+ region 1104 (N=$10^{17}$–$10^{20}$ cm$^{-3}$) and a channel stopper p+ region 1105 (N=$10^{17}$–$10^{20}$ cm$^{-3}$), which also serves to set a substrate potential are formed on the n substrate 1101, a p+ polysilicon gate electrode $G_N$ 1107 is formed on an insulation layer 1106, and a source electrode $S_N$ 1108, a drain electrode $D_N$ 1109 and a channel stopper electrode $C_p$ 1110 are contacted to the corresponding regions through contact windows. As a result, a buried channel n MOS having the source-drain channel covered by a depletion layer is formed on the n substrate 1101.

Similarly, a source p+ region 1111 (N=$10^{17}$–$10^{20}$ cm$^{-3}$), a drain p+ region 1112 (N=$10^{17}$–$10^{20}$ cm$^{-3}$), and a channel stopper p+ region 1113 (N=$10^{17}$–$10^{20}$ cm$^{-3}$), which also functions to set a well potential are formed on the p well 1102, an n+ polysilicon gate electrode Gp 1114 is formed on the insulation layer 1106, and a source electrode Sp 1115, a drain electrode Dp 1116 and a channel stopper electrode $C_N$ 1117 are contacted to the corresponding regions through contact windows. As a result, a buried channel PMOS having a source-drain channel covered by a depletion layer is formed on the p well 1102. Numeral 1118 denotes a substrate electrode.

The gate electrode $G_N$ 1107 of the nMOS and the gate electrode Gp 1114 of the pMOS are interconnected to form an input terminal of the CBCM-SIT inverter, and the drain electrode $D_N$ 1109 of the nMOS and the drain electrode Dp 1116 of the pMOS are interconnected to form an output terminal of the CBCM-SIT inverter.

The source electrode $S_N$ 1108 if the nMOS is connected to a power supply $V_{SS}$ and the source electrode $S_p$ 1115 of the pMOS is connected to a power supply $V_{DD}$ ($>V_{SS}$). The channel stopper electrode $C_P$ 1110 of the nMOS is connected to $V_{SS}$, and the channel stopper electrode $C_N$ 1117 of the pMOS is connected to $V_{DD}$.

Since the channels of both the nMOS and the pMOS of the CBCM-SIT inverter are of the same conductivity type to that of the source and drain, the punch-through in which the drain depletion layer spreads as the drain voltage increases and finally contacts the source depletion layer over a wide area does not occur in principle.

A channel which is in the perfect depletion state and is not dependent on the source and drain, like the one attained in the present embodiment, is defined as a reach-through channel. (A conventional buried channel is different from the present embodiment in that it is designed to create a neutral region in a main operation region).

From FIG. 12 (c), the condition for the reach-through is derived for a channel depth.

FIG. 12 (c) illustrates the distribution of the depletion layer and the presence of the neutral region. In order for the depletion layers of the channels under the gate electrode $G_N$ 1107 of the nMOS and the gate electrode $G_P$ 1114 of the pMOS to be independent from the voltage of the gate electrode and exist stably, it is desirable to use the depletion layer generated in the substrate or well.

Thus, in the nMOS, a thickness $Y_n$ of the depletion layer formed in the n substrate 1101 in adjacent to the channel stopper p+ region 1105, a depth $Y_{po}$ of the p+ region 1105 and a depth $Y_n$ of the source and drain n+ regions 1103 and 1104 meet the condition $$Y_n + Y_{po} > Y_n \quad (38)$$

Similarly, in the pMOS, the thickness $Y_p$ of the depletion layer formed in the p well 1102 adjacent to the channel stopper n+ region 1113, the depth $Y_{no}$ of the n+ region 1113 and the depth $Y_p$ of the source and drain p+ regions 1111 and 1112 meet the condition of $$Y_P + Y_{no} > Y_p \quad (39)$$

The formulas (38) and (39) indicate the longitudinal condition for the reach-through. As a result, the source and the drain are confined in the perfectly depleted area.

From FIG. 12 (a), the reach-through condition for the channel is derived. Since it is again necessary that the depletion layer does not depend on the gate voltage, the depletion layer of the substrate or well which is adjacent to the channel stopper is utilized.

Accordingly, in the nMOS, the channel width $W_N$ meets $$W_N \leq 2y_n \quad (40)$$

Similarly, in the pMOS, the channel width $W_p$ meets $$W_p \leq 2y_p \quad (41)$$

The formulas (40) and (41) show the lateral condition for the reach-through.

A CBCM-SIT inverter which meets the formulas (38)–(41) may be arranged in the p well region 1102' or the channel stopper n+ region 1113, as shown in FIGS. 12 (d) and 12 (e).

FIGS. 12 (f) and 12 (g) show parasitic bipolar transistors in FIGS. 12 (b) and 12 (e). In both cases, an npn transistor $T_{r1}$ is formed between the channel stopper p+ region 1105 of the nMOS and the source n+ region 1103, and the p well 1102 (or 1102'), and an npn transistor $T_{r2}$ is formed between the channel stopper n+ region 1113 of the pMOS and the source p+ region 1111, and the n substrate 1101. FIG. 12 (b) shows an equivalent circuit in which $R_2$ and $R_4$ are distributed resistances of the channel stopper p+ region 1105 and n+ region 1111, and $R_1$ and $R_3$ are base distributed resistances of the parasitic pnp and npn transistors. As seen from a comparison with FIG. 3 (c), the parasitic bipolar transistors in the present embodiment are connected in the opposite polarity. Therefore, latch-up does not occur in principle.

In accordance with the present embodiment, since the channel is of the same conductivity type as that of the source and drain, latch-up and the punch-through do not occur in principle. Accordingly, the reduction of $V_T$ due to the short channel caused by the punch-through does not occur.

Since the perfect depletion of the channel (i.e. reach-through) causes the depletion layers in the substrate and the well, $V_T$ is rather increased.

Since the channel is perfectly depleted, the electric field does not locally concentrate but has a gentle slope. Thus, the generation of hot carriers is significantly suppressed. Since the channel is of the same conductivity type as that of the source and drain, the parasitic bipolar transistor which increases the substrate current or well current does not exist, and the fall of the breakdown voltage due to the hot carriers does not occur.

Figure 13A:
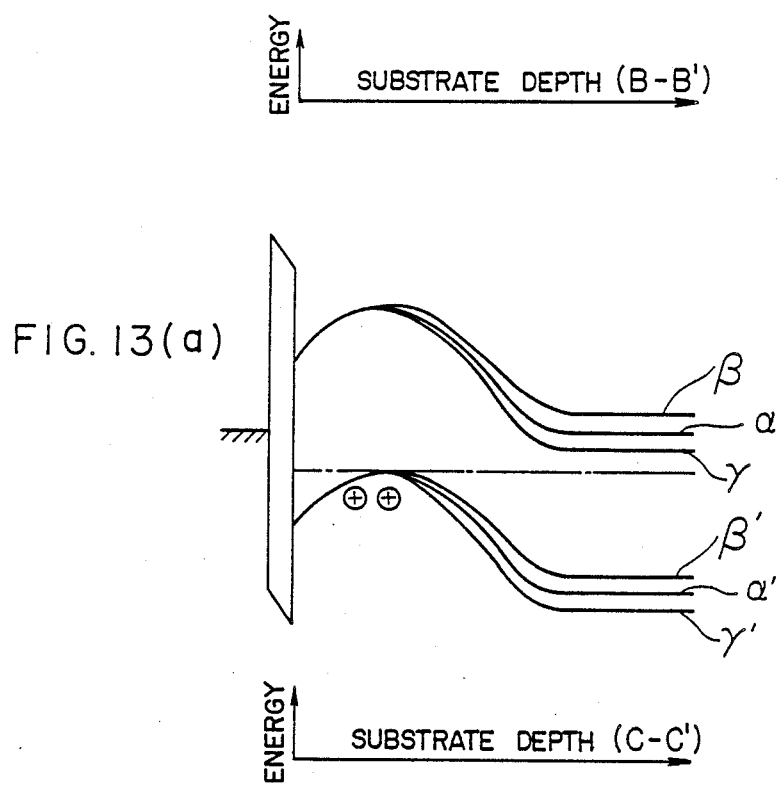
Figure 13B:
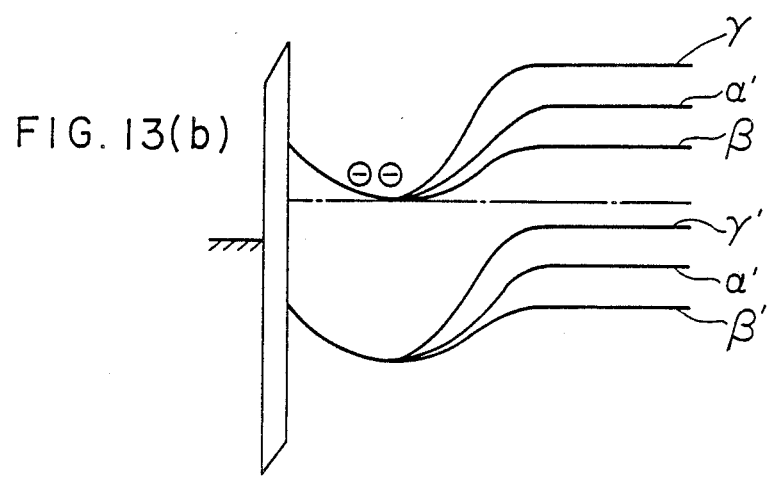

The operation of the present embodiment is now explained. FIG. 13 shows energy bands along B—B' and C—C' of FIG. 12 (b).

FIG. 13 (a) shows the energy band along B—B' of FIG. 12 (b), and curves $\gamma$ and $\gamma'$ show the energy bands when the channel stop n+ region 1113 of the pMOS does not exist, and curves $\gamma$ and $\gamma'$ show the energy bands in the vicinity of the channel stop. Curves $\alpha$ and $\alpha'$ show the combined curves. As seen from FIG. 13 (a), the holes in the pMOS flow not on the surface of the p well 1102 but through the buried channel.

FIG. 13 (b) shows the energy band along C—C' of FIG. 12 (b). Curves $\beta$ and $\beta'$ show energy bands when the channel stop p+ region 1105 of the nMOS does not exist, and curve $\gamma$ and $\gamma'$ show energy bands in the vicinity of the channel stop. Curves $\alpha$ and $\alpha'$ show combined curves. As seen from FIG. 13 (b), electrons in the nMOS flow not on the surface of the n substrate 1101 but through the buried channel.

Thus, since the carriers flow through the buried channel, the noise characteristic and the speed characteristic of the CBCM-SIT are improved by a factor of 2–3 over those of the conventional CMOS which utilizes the surface channel.

A double well method which has been usually used to optimize the characteristics of the pMOS and the nMOS caused by a difference between mobilities of electrons and holes can be applied to the present invention. An embodiment thereof is shown in FIG. 14. A p well 1102 or 1102″ and an n well 1101' or 1101″ are formed on an i region 1302 ($N = 10^{12} - 10^{14}$ cm$^{-3}$. It may be n$^{--}$ or p$^{--}$) epitaxially formed on an n+ substrate 1301. The double well method in the present invention is different from the conventional double well method in that it has all of the features described above.

Another embodiment of the CBCM-SIT which overcomes the problems encountered in the conventional CMOS and improves the performance is explained with reference to FIGS. 15 and 16.

Figures 15A, 15B:
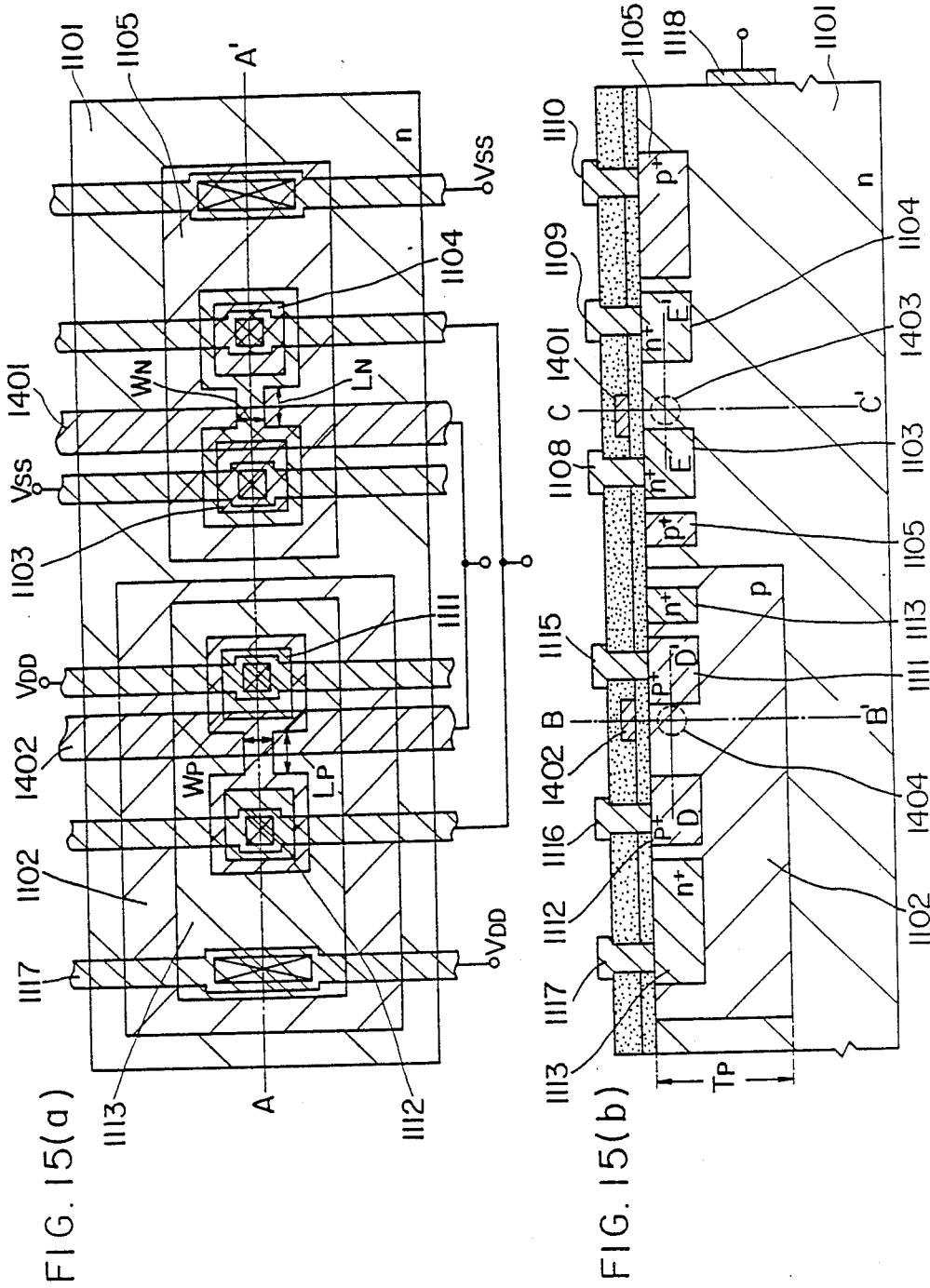

FIG. 15 is similar to FIG. 12 except that a p+ polysilicon gate electrode 1401 of the nMOS is concentrated on the source side of the channel, the channel width $W_N$ determined by the channel stop p+ region 1105 is narrow, the n+ polysilicon gate electrode 1402 of the pMOS is concentrated in the source side of the channel, and the channel width $W_p$ determined by the channel stop n+ region 1113 is narrow.

Figure 16:
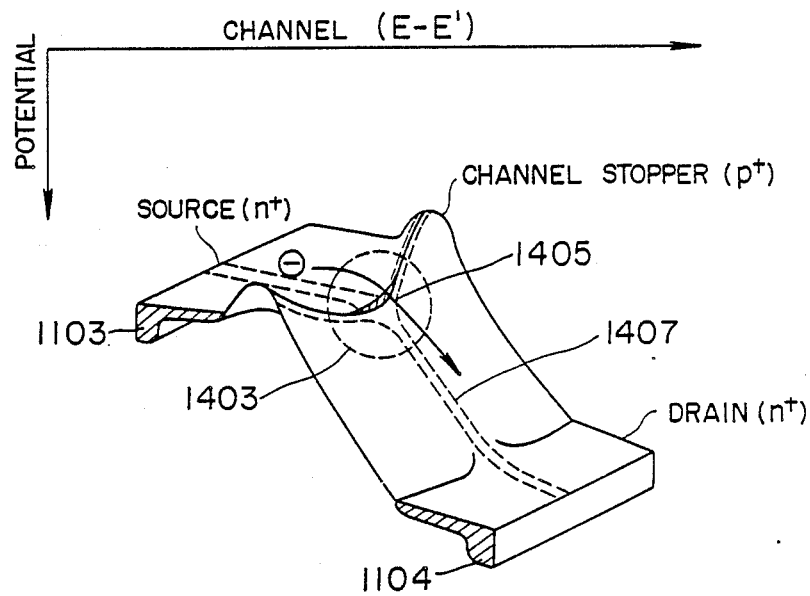
Figure 16:
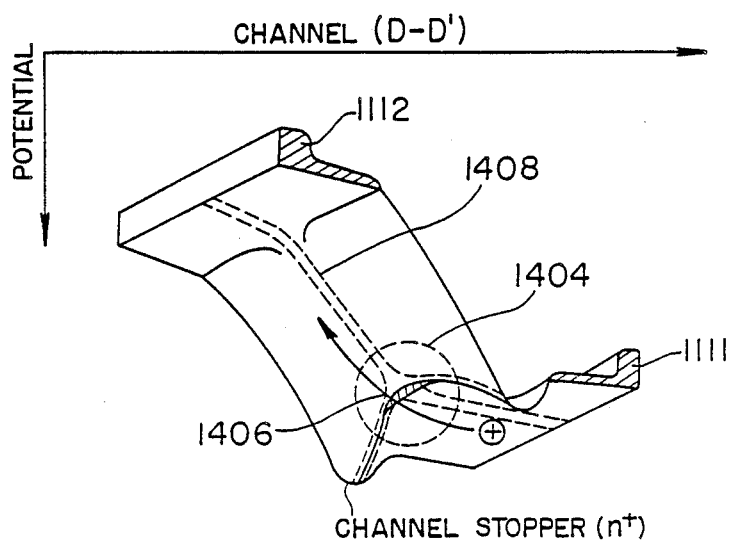

As the gate electrodes and the channel widths are changed in this manner, the saddle-shaped potential barrier 1405 to the electrons shown in FIG. 16 (a) appears in front of the source n+ region 1103 of the nMOS, and the height of the potential barrier 1405 controls the flow rate of the electrons which flow mainly from the source to the drain over the potential barrier. Since the potential barrier 1405 has a function of a gate, it is called an intrinsic gate and the region in which the potential barrier 1405 exists is called an intrinsic gate region 1403. The electrons which flow from the source to the drain over the saddle-shaped potential barrier 1405 concentrate to the center 1407 of the channel. Similarly, a saddle-shaped potential barrier 1406 to the holes shown in FIG. 16 (b) appears in front of the source p+ region 1111 of the pMOS, and the height of the potential barrier controls the flow rate of the holes which flow mainly from the source to the drain over the potential barrier 1406. A region in which the potential barrier 1406 exists is called an intrinsic gate region 1404 and the holes concentrate to the center 1408 of the channel.

In FIGS. 15 and 16, $r_{sn}$ is the resistance between the source n+ region 1103 and the potential barrier 1405 of the nMOS, $g_{mn}$ is the mutual conductance which the potential barrier 1405 inherently has as the intrinsic gate, $g'_{mn}$ is the apparent mutual conductance which externally appears, $r_{sp}$ is the resistance between the source p+ region 1111 and the potential barrier 1406 of the pMOS, $g_{mp}$ is the mutual conductance which the potential barrier 1406 inherently has as the intrinsic gate, and $g'_{mp}$ is the apparent mutual conductance which externally appears. Thus, $$g'_{mn} = \frac{g_{mn}}{1 + g_{mn} \cdot r_{sn}} \tag{42}$$

$$g'_{mp} = \frac{g_{mp}}{1 + g_{mp} \cdot r_{sp}} \tag{43}$$

and $$g_{mn} \cdot r_{sn} \gg 1, \; g_{mp} \cdot r_{sp} \gg 1$$

(In a conventional MOS, $g_{mn} \cdot r_{sn} < 1$ and $g_{mp} \cdot r_{sp} < 1$, and $g'_{mn}$ and $g'_{mp}$ which are smaller than $g_{mn}$ and $g_{mp}$ are used.)

From the formulas (42) and (43), $$g'_{mn} \simeq g_{mn}, \; g'_{mp} \simeq g_{mp}$$

and the mutual conductances of the inherent gate are used as they are. This function is nothing but the IBCM-SIT having the buried channel.

As $r_s$ reduces, the large conductance of the intrinsic gate can be used and the speed characteristic and the noise characteristic are improved, and the microminaiturization is attained.

However, because of the coupling capacitance, there is a possibility that the potential barrier is affected by the drain voltage although it is not affected by the punch-through. In this case, the drain current exhibits a nonsaturation characteristic to the drain voltage. This will more likely occur as the microminaiturization is promoted.

On the other hand, in an integrated circuit, a circuit which exactly sets a potential is frequently required. In such a case, a saturation characteristic with a high voltage gain is desirable.

A gain $A_v$ per stage of an amplifier is given by $$A_V = g_m R_L \cdot \frac{1}{1 + R_L/r_D} \tag{44}$$

where
$R_L$: load resistance
$I_D$: drain current
$V_D$: drain voltage
$V_G$: gate voltage
$g_m = (\partial I_D / \partial V_G)$: mutual conductance
$r_D = (\partial I_D / \partial V_D)^{-1}$: drain internal resistance
Av is maximum when $r_D$ is large or the saturation characteristic exists.

A method for maintaining $g'_{mn} \simeq g_{mn}$ and $g'_{mp} \simeq g_{mp}$ in the formulas (42) and (43) and attaining Av $\simeq g_m R_L$ in the formula (44) has been attained in the ISIS-SIT.

Those conditions can be applied to FIG. 15. That is, the following conditions are to be met.

$$L_n > W_N > Y_n - Y_{po} \tag{45}$$

$$L_p > W_p > Y_p - Y_{no} \tag{46}$$

where $Y_n$, $Y_{po}$, $Y_p$, $Y_{no}$ are defined in the same manner as that in FIG. 12 (c).

When the formulas (45) and (46) are met, the potential barriers 1405 and 1406 are electrostatically shielded from the channel stopper p+ region 1113 and they are not affected by the drain voltage. As a result, the saturation characteristic to the drain voltage by the drain current is attained. In the conventional FET, $r_{sn}$ and $v_{sp}$ in the formulas (42) and (43) are large and the saturation characteristic is exhibited by the negative feedback effect. As a result, only a mutual conductance which is smaller than the mutual conductance of the intrinsic gate can be utilized. In addition, $r_{sn}$ and $r_{sp}$ are large and hence noise is large and the response characteristic is poor. (For example, H. Tango et al., Solid-State Electronics, Vol. 13, p. 139, 1970).

In accordance with the present embodiment of the ICBM-SIT, a high mutual conductance, a low noise characteristic and a high response characteristic are more readily attained with the microminiaturization, and the three big problems encountered in the prior art CMOS are overcome. Accordingly, it is advantageous to a high density and microminiaturized device.

The conductivity types of the above embodiments may be totally reversed.

When the design concept of the present invention is applied to SOS-CMOS or SOI-CMOS (SOS: silicon on saphire, SOI: silicon on insulator), the performance will be further improved (because as shown in case A of Table 1, the conventional SOI-CMOS or SOS-CMOS, which is not constructed in accordance with the present invention, does not exhibit latch-up but cannot avoid the short channel effect and the hot carrier problem.)

In accordance with the present embodiment, the three major problems encountered in the conventional CMOS as it is microminiaturized (which are also the problems to be resolved by the present invention), that is, (1) latch-up
(2) fall of $V_T$ due to a short channel, and
(3) fall of breakdown voltage by hot carriers are eliminated in principle and high performance is readily attained.

High density and a microminiaturized device is attained.

In accordance with the present invention, the punch-through and hot carrier problems encountered in the conventional MOSFET and insulated gate SIT as they are microminiaturized are overcome in principle. By forming the static shield region, the insulated gate SIT having a triode characteristic (nonsaturation characteristic) is readily modified to the insulated gate SIT having an ideal tetrode or pentode characteristic (saturation characteristic). In the complementary circuit constructed by the insulated gate SIT of the present invention, latch-up does not occur in principle.

I claim:

1. A semiconductor device exhibiting a nonsaturation current characteristic, comprising:
   a semiconductor substrate of a first conductivity type and having a first impurity concentration;

a semiconductor region of said first conductivity type formed in said semiconductor substrate, said semiconductor region having a second impurity concentration lower than said first impurity concentration;

source and drain regions of a second conductivity type formed in said semiconductor region and having said first impurity concentration, a source-drain channel serving as a carrier path being formed in said semiconductor region, said source-drain channel having a substantially perfect depletion state;

an insulated gate electrode interposed between said source and drain regions in the vicinity of said source region and outside said drain region; and a channel stop region of said first conductivity type formed in said semiconductor region in the vicinity of said source-drain channel and under said gate electrode, said channel stop region having said first impurity concentration, the width of said source-drain channel immediately under said gate electrode being narrower than the width of said channel at any other part thereof, and the width of said channel, the impurity concentration of said semiconductor substrate and the impurity concentration of said semiconductor region having values such that a saddle-shaped potential barrier is created in said source-drain channel under said insulated gate electrode.

2. A semiconductor device according to claim 1 wherein said insulated gate electrode comprises an insulated layer having a trench therein and a gate electrode located in said trench, said insulated layer being interposed between said gate electrode and said semiconductor region.

3. A semiconductor device according to claim 1 wherein said drain region includes a drain electrode, and which further comprises two electrostatic shield regions formed between said gate and drain electrodes, said two electrostatic shield regions sandwiching said channel region therebetween.

4. A semiconductor device comprising:

first and second semiconductor regions of first and second conductivity type respectively, said second semiconductor region being formed within said first semiconductor region, said first and second semiconductor regions each having a given impurity concentration;

first source and drain regions of said first conductivity type formed in said first semiconductor region, said first source and drain regions having impurity concentrations which are higher than said given impurity concentration;

a first channel stopper region of said second conductivity type formed in said first semiconductor region, said first channel stopper region having an impurity concentration higher than said given impurity concentration, a first depletion layer being formed in said first semiconductor region by said first channel stopper region, said first depletion layer extending under said first source region, said first drain region, a first channel between said first source and drain regions, and said second semiconductor region, said first channel having a substantially perfect depletion state;

a first insulation layer formed over said first channel;

a first gate electrode of said second conductivity type formed over said first insulation layer between said first source and drain regions to form a first transistor, said first gate electrode being in the vicinity of said source region and outside said drain region, the width of said first channel under said first gate electrode being narrower than the width of the remainder of said first channel, whereby a saddle-shaped intrinsic first gate region exists in said first channel in the vicinity of said first source region;

second source and drain regions of said second conductivity type formed in said second semiconductor region, said second source and drain regions having impurity concentrations which are higher than said given impurity concentration;

a second channel stopper region of said first conductivity type formed in said second semiconductor region, said second channel stopper region having an impurity concentration higher than said given impurity concentration, a second depletion layer being formed in said second semiconductor region by said second channel stopper region, said second depletion layer extending under said second source region, said second drain region and a second channel between said second source and drain regions, said second channel having a substantially perfect depletion state;

a second insulation layer formed over said second channel;

a second gate electrode of said first conductivity type formed over said second insulation layer between said second source and drain regions to form a second transistor, said second gate electrode being in the vicinity of said source region and outside said drain region, the width of said second channel under said second gate electrode being narrower than the width of the remainder of said second channel, whereby a saddle-shaped intrinsic second gate region exists in said second channel in the vicinity of said second source region, said first and second gate electrodes being interconnected and said first and second drain regions being interconnected to form a complementary transistor.

5. A semiconductor device according to claim 3 wherein said electrostatic shield region is a shield gate region of the second conductivity type formed in said semiconductor region in the vicinity of said drain region, the width $W_{G2}$ of said channel determined by said shield gate region, the length $L_{G2}$ of said channel having the width $W_{G2}$, the thickness $T_E$ of said semiconductor region and the thickness $D_{G2}$ of the shield gate region meeting the condition $$L_{G2} > W_{G2} > T_E - D_{G2}$$

6. A semiconductor device according to claim 3 wherein said electrostatic shield regions are high impurity concentration regions of the first conductivity type and adjacent to said channel, the distance $L_{GG'}$ between said insulated gate electrode and said drain, the channel width $W_G$, the channel depth $D_C$ and the thickness $T_E$ of said semiconductor region meeting the condition $$L_{GG'} > W_G > T_E - D_C.$$

* * * * *